United States Patent [19]

Kato

[11] Patent Number: 5,750,897
[45] Date of Patent: May 12, 1998

[54] ACTIVE ANTI-VIBRATION APPARATUS AND METHOD OF MANUFACTURING THE SAME

[75] Inventor: Hiroaki Kato, Utsunomiya, Japan

[73] Assignee: Canon Kabushiki Kaisha, Tokyo, Japan

[21] Appl. No.: 660,961

[22] Filed: Jun. 12, 1996

[30] Foreign Application Priority Data

Jun. 14, 1995 [JP] Japan .................... 7-147412
Jan. 26, 1996 [JP] Japan .................... 8-031163

[51] Int. Cl.$^6$ ........................... G01M 7/00
[52] U.S. Cl. .................. 73/663; 73/DIG. 10; 73/DIG. 1; 248/550; 318/649
[58] Field of Search ............... 73/663, DIG. 10, 73/DIG. 1; 248/550, 637, 639; 108/37, 51.1; 318/560, 561, 649

[56] References Cited

U.S. PATENT DOCUMENTS

| | | | |
|---|---|---|---|
| 4,796,873 | 1/1989 | Schubert | 267/136 |
| 4,821,205 | 4/1989 | Schutten et al. | 364/508 |
| 5,000,415 | 3/1991 | Sandercock | 248/550 |
| 5,049,795 | 9/1991 | Moulds, III | 318/561 |
| 5,052,529 | 10/1991 | Sutcliffe et al. | 188/378 |
| 5,239,789 | 8/1993 | Uno et al. | 52/1 |
| 5,285,995 | 2/1994 | Gonzalez et al. | 248/550 |
| 5,378,974 | 1/1995 | Griffin | 318/649 |
| 5,478,043 | 12/1995 | Wakui | 248/550 |

FOREIGN PATENT DOCUMENTS

| | | | |
|---|---|---|---|
| 0275664 | 7/1988 | European Pat. Off. | B60G 17/00 |
| 0530075 | 3/1993 | European Pat. Off. | B64C 27/00 |
| 0539930 | 5/1993 | European Pat. Off. | F16F 15/00 |
| 0676558 | 10/1995 | European Pat. Off. | F16F 15/00 |
| 6167414 | 6/1994 | Japan | G01M 7/00 |
| 7083276 | 3/1995 | Japan | F16F 15/02 |

*Primary Examiner*—Hezron E. Williams
*Assistant Examiner*—Richard A. Moller
*Attorney, Agent, or Firm*—Fitzpatrick, Cella, Harper & Scinto

[57] ABSTRACT

An active anti-vibration apparatus detects the motion of an anti-vibration table for supporting equipment with a plurality of sensors and controls actuators on the basis of detection outputs from the sensor. The sensors are arranged such that, when a motion parameter of the anti-vibration table is represented by a vector P, and an output signal group from the plurality of sensors is represented by a vector S, a condition number of a matrix A defined by an equation S=AP established between the vector P and the vector S in accordance with a geometrical arrangement of the plurality of sensors is minimized.

38 Claims, 10 Drawing Sheets

$\theta a = \theta b = \theta c = \theta$ $\theta a = \theta b = \theta c = \theta$

ACTIVE ANTI-VIBRATION APPARATUS AND METHOD OF MANUFACTURING THE SAME

BACKGROUND OF THE INVENTION

The present invention relates to an active anti-vibration apparatus and a method of manufacturing the same and, more particularly, to an active anti-vibration apparatus serving as a support mechanism for all mechanical systems including precision equipment represented by a semiconductor exposure apparatus, and a method of manufacturing the same.

Along with an advance in precision of precision equipments such as an electron microscope, a step and repeat (scan) type semiconductor exposure apparatus, and semiconductor exposure apparatuses of other types, a higher performance is required of a precision anti-vibration apparatus for mounting the equipment.

Particularly, in a semiconductor exposure apparatus, an anti-vibration table for removing vibrations transmitted from outside the apparatus, e.g., a vibration of the setting floor, is necessary for an appropriate and quick exposure operation. This is because, when each shot area on a semiconductor wafer is to be exposed, the X-Y stage on which the semiconductor wafer moves along the X-Y plane must be completely stationary. The X-Y stage has as its feature an intermittent operation called "step and repeat". Repeated step vibrations in this operation produce vibrations of the support table (anti-vibration table) itself which supports the equipment.

Therefore, both anti-vibration performance for external vibrations and vibration damping performance for vibrations caused by the operation of the equipment itself are required of the anti-vibration table in a good balance. To meet this requirement, an active anti-vibration apparatus has been put in practice in which the vibration of the anti-vibration table is detected by a vibration sensor, and an output signal from the vibration sensor is compensated and fed back to an actuator, thereby actively performing vibration damping. The active anti-vibration apparatus allows realization of anti-vibration performance and vibration control performance in a good balance, which is difficult for a conventional passive anti-vibration apparatus constituted only by a support mechanism having spring and damper characteristics.

An active anti-vibration apparatus is disclosed in, e.g., Japanese Patent Laid-Open No. 6-167414. In this prior art, a total of seven sensors are arranged to calculate translation and rotation motions of 6-degree-of-freedom of the anti-vibration table. The detail of the sensor arrangement is as follows. On an orthogonal coordinate system wherein the long side direction of the rectangular anti-vibration table matches the X-axis while the vertical direction matches the Z-axis, one sensor is arranged in the X-axis direction, two are arranged in the Y-axis direction, and four are arranged in the Z-axis direction.

In anti-vibration table control by the above active anti-vibration apparatus, motions in the directions of translation and rotation of the anti-vibration table, as the motions of a rigid body, are calculated from output signals from the sensors, and feedback loops are formed in units of motion directions. Therefore, the sensors must be arranged to allow detection of the motions in the directions of translation and rotation of the anti-vibration table as the motions of a rigid body. In addition, the sensors are preferably arranged to minimize any errors in calculation result, which are caused by observation noise included in the sensor output signals or the difference between the nominal value and the true value of a sensor position.

With the sensor arrangement of the above Japanese Patent Laid-Open No. 6-167414, the translation and rotation motions of 6-degree-of-freedom of the anti-vibration table can be calculated, though the influence of observation noise included in sensor output signals or the difference between the nominal value and the true value of a sensor position, which acts on the calculation result, is not considered at all. In addition, for a sensor arrangement for precisely calculating the translation and rotation motions of 6-degree-of-freedom of the anti-vibration table, no definite quantitative guideline is presented.

Another active anti-vibration apparatus will be described below. FIG. 10 shows the arrangement of an active anti-vibration apparatus. An anti-vibration table 105 for mounting precision equipment such as an X-Y stage 111 is supported by three anti-vibration units. The anti-vibration units are arranged at the three corners of the anti-vibration table 105. The anti-vibration units have the same arrangement and are discriminated by adding suffixes a, b, and c to the reference numeral. An anti-vibration unit 101a comprises an actuator 102a for applying a driving force to the anti-vibration table 105 in the horizontal direction, and an acceleration sensor 103a and a position sensor 104a, which are used to detect the horizontal vibration of the anti-vibration table 105. In practice, the anti-vibration unit 101a includes as constituent elements (not shown) mechanisms such as a mechanical spring, or a servo valve for supplying air as a working fluid if the actuator 102a consists of, e.g., an air spring. However, FIG. 10 only schematically shows the arrangement of the anti-vibration apparatus, and constituent elements essential for active vibration control of the anti-vibration table 105 are represented by elements shown in FIG. 10. This also applies to anti-vibration units 101b and 101c.

Control in units of motion modes is disclosed in Japanese Patent Laid-Open No. 7-83276 as a method of controlling the active anti-vibration apparatus, in which motion modes associated with the acceleration of the anti-vibration table and motion modes associated with the position are extracted from signals from a plurality of acceleration sensors and position sensors, thereby performing optimum compensation in units of motion modes. This control in units of motion modes will be described in detail assuming that control in units of horizontal motion modes is applied to the active anti-vibration apparatus shown in FIG. 10.

Regarding the anti-vibration table 105 as a rigid body, the horizontal rigid body motions of the anti-vibration table 105 are classified into motion modes of total 3-degree-of-freedom constituted by translations of 2-degree-of-freedom and rotation of single-degree-of-freedom. An X-Y-Z orthogonal coordinate system is set on the anti-vibration table 105 such that the origin matches a center of gravity G of the anti-vibration table 105, and the Z-axis direction matches the vertical direction. At this time, the horizontal rigid body motions of the anti-vibration table 105 can be classified into three motion modes consisting of X-axis direction translation, Y-axis direction translation, and rotation about the Z-axis. When the acceleration sensors and position sensors incorporated in the respective anti-vibration units to detect the horizontal vibration of the anti-vibration table 105 are included in the X-Y plane defined by the X-Y-Z coordinate system or arranged near the X-Y plane, i.e., in other words, when the acceleration sensors and position sensors are included in a horizontal plane including the center of gravity G of the anti-vibration table 105 or arranged near the horizontal plane, the horizontal motion modes of 3-degree-of-freedom associated with the acceleration of the anti-vibration table 105 and the horizontal motion modes of 3-degree-of-freedom associated with the position can be extracted from signals from the acceleration sensors and position sensors incorporated in the respective anti-vibration units.

Referring to FIG. 10, a motion mode extraction unit 106 extracts horizontal motion modes $a_x$, $a_y$, and $a\theta_z$ associated with the acceleration from output signals $a_a$ to $a_c$ from acceleration sensors 103a to 103c incorporated in the three anti-vibration units 101a to 101c, respectively. In this case, $a_x$ represents the X-axis direction translation acceleration; $a_y$ represents the Y-axis direction translation acceleration, and $a\theta_z$ represents the angular acceleration about the Z-axis. Normally, the active anti-vibration apparatus has a function of controlling positioning of the anti-vibration table 105. A motion mode extraction unit 106' extracts horizontal motion modes $e_x$, $e_y$, $e\theta_z$ associated with the position from position deviation signals $e_a$ to $e_c$ which are obtained when output signals from position sensors 104a to 104c incorporated in the three anti-vibration units 101a to 101c, respectively, are compared with and subtracted from a position target signal. In this case, $e_x$ represents the X-axis translation position deviation, $e_y$ represents the Y-axis translation position deviation, and $e\theta_z$ represents the rotation angular deviation about the Z-axis. The motion mode extraction units 106 and 106' extract the horizontal motion modes of 3-degree-of-freedom from the received three sensor signals.

Anti-vibration table driving forces in units of motion modes associated with the acceleration and position are generated by appropriately compensating outputs from the motion mode extraction units 106 and 106'. As a compensator for compensating an output from the motion mode extraction unit 106 associated with the acceleration, a proportional gain is suitable assuming that the actuators use air springs. As a compensator for compensating an output from the motion mode extraction unit 106' associated with the position, a PI compensator is suitable to allow convergence of the position deviation in the steady state to zero. P of the PI compensator means a proportional operation, and I means an integrating operation. In FIG. 10, a proportional gain 109 is used to compensate the motion modes $a_x$, $a_y$, and $a\theta_z$ associated with the acceleration to generate anti-vibration table driving force $F''_x$, $F''_y$, and $M''_z$ in units of motion modes associated with the acceleration. In addition, a PI compensator 108 is used to compensate the motion modes $e_x$, $e_y$, and $e\theta_z$ associated with the position to generate anti-vibration table driving forces $F'_x$, $F'_y$, and $M'_z$ in units of motion modes associated with the position. The anti-vibration table driving forces $F''_x$, $F''_y$, and $M''_z$ in units of motion modes associated with the acceleration and the anti-vibration table driving forces $F'_x$, $F'_y$, and $M'_z$ in units of motion modes associated with the position are added by an adder 110, respectively, thereby generating final anti-vibration table driving forces $F_x$, $F_y$, and $M_z$ in units of motion modes. In this case, $F_x$ and $F_y$ represent the X-axis and Y-axis direction translation forces, respectively, and $M_z$ represents the moment about the Z-axis.

The anti-vibration table driving forces $F_x$, $F_y$, and $M_z$ in units of motion modes are distributed to the actuators 102a to 102c, respectively, and applied to the anti-vibration table 105. When the actuators 102a to 102c incorporated in the respective anti-vibration units are included in the horizontal plane including the center of gravity of the anti-vibration table 105 or arranged near the horizontal plane, the actuators 102a to 102c can apply the anti-vibration table driving forces $F_x$, $F_y$, and $M_z$ in units of motion modes to the anti-vibration table 105 without affecting the vertical motion mode of the anti-vibration table 105. In other words, without affecting the vertical motion mode, the anti-vibration table driving forces $F_x$, $F_y$, and $M_z$ in units of motion modes can be distributed to the actuators 102a to 102c. In FIG. 10, outputs from a motion mode distribution unit 107 for distributing the anti-vibration table driving forces $F_x$, $F_y$, and $M_z$ in units of motion modes to the actuators 102a to 102c become actuator thrusts $F_a$ to $F_c$ generated from the actuators 102a to 102c, respectively.

As described above, when control in units of motion modes is applied to the active anti-vibration apparatus, posture control with optimum compensation in units of motion modes can be performed for the position, and optimum damping in units of motion modes is enabled for the acceleration.

In the arrangement of the active anti-vibration apparatus shown in FIG. 10, the three actuators 102a to 102c are arranged in correspondence with the number of anti-vibration units serving as a support mechanism. The horizontal motion modes of the anti-vibration table 105 have a 3-degree-of-freedom. Therefore, the calculation method for distributing the anti-vibration table driving forces in units of motion modes in the motion mode distribution unit 107 is limited to only one. This distribution calculation is uniquely determined in accordance with the geometrical positional relationship between the actuators 102a to 102c and the center of gravity of the anti-vibration table 105.

In a conventional semiconductor exposure apparatus, generally, the anti-vibration table is supported by four anti-vibration units. The X-Y stage mounted on the anti-vibration table has as its feature an intermittent operation called "step and repeat". The repeat step operation is performed by setting the main step direction in the X direction or Y direction of the X-Y stage. When the anti-vibration table is supported by four anti-vibration units, actuators incorporated in the anti-vibration units to drive the anti-vibration table in the horizontal direction are normally arranged such that two of them are arranged to generate a thrust in the X direction of the X-Y stage, and the remaining two are arranged to generate a thrust in the Y direction of the X-Y stage. With this arrangement, the vibration of the anti-vibration table, which is excited by the step drive reaction in the step operation of the X-Y stage, can be effectively suppressed. More specifically, in the step operation of the X-Y stage, a large vibration is generated in the anti-vibration table along the step direction. When two actuators are arranged in the X and Y directions, respectively, an equal driving force can be applied to the anti-vibration table along the step direction in both the X-direction step and Y-direction step operation of the X-Y stage.

To the contrary, for the arrangement wherein the anti-vibration table 105 is supported by the three anti-vibration units 101a to 101c, as shown in FIG. 10, no definite guideline has been given yet as to the arrangement of the actuators 102a to 102c. For example, when two actuators are arranged to generate a thrust in the X-axis direction while the remaining one is arranged to generate a thrust in the Y-axis direction, and the three actuators can generate equal maximum thrusts, the Y-axis translation thrust $F_y$ acting on the anti-vibration table 105 is only ½ the X-axis translation thrust $F_x$. When all the actuators 102a to 102c are arranged toward the center of gravity G of the anti-vibration table 105, almost equal translation thrusts can be applied to the anti-vibration table 105 in all directions in the horizontal plane. However, no moment $M_z$ is generated about the Z-axis at all, so the vibration of the anti-vibration table 105 in the direction of rotation about the Z-axis cannot be suppressed. To effectively suppress the vibration of the anti-vibration table, which is excited by the step operation of the X-Y stage in an arbitrary direction, the actuators 102a to 102c must be arranged to equally generate anti-vibration table driving forces $F_x$, $F_y$, and $M_z$ in units of motion modes. In a scan type exposure apparatus, the stage mounted on the anti-vibration table is mainly driven in the scanning direction, and it is desired to allow application of a large driving force to the anti-vibration table along the scanning direction. More specifically, it is desired to arrange the actuators to generate desired maximum driving forces for the respective anti-vibration table driving forces $F_x$, $F_y$, and $M_z$ in units of motion modes. However, a technique for realizing such an actuator arrangement has not been established yet.

In addition, generally, an actuator does not always generate a thrust according to the command value from a controller. Some variations in thrust caused by factors such as torque ripples cannot be avoided. Furthermore, to design the motion mode distribution unit 107, it is essential to determine the positional relationship between the center of gravity G of the anti-vibration table 105 and the actuators 102a to 102c. However, it is difficult to accurately measure the positions of the actuators in fact. Some errors between the measured value and the true value cannot be avoided. For control in units of motion modes, it is preferable that the desired anti-vibration table driving forces $F_x$, $F_y$, and $M_z$ in units of motion modes be properly applied to the anti-vibration table 105 regardless of variations in actuator thrusts or measurement errors of the actuator position. Therefore, the actuators must be arranged such that the influence of variations in actuator thrust is minimized. However, a technique for realizing such an actuator arrangement has not been established yet.

SUMMARY OF THE INVENTION

The present invention has been made in consideration of the above situation, and has as its object to provide an active anti-vibration apparatus which enables highly precise anti-vibration control by precisely calculating the translation and rotation motions of an anti-vibration table as rigid body motions while minimizing the influence of error factors such as observation noise.

It is another object of the present invention to provide a method of manufacturing an active anti-vibration apparatus, which enables to precisely calculate the translation and rotation motions of an anti-vibration table as rigid body motions while minimizing the influence of error factors such as observation noise.

According to the present invention, there is provided an active anti-vibration apparatus having a plurality of sensors and actuators, which detects a motion of an anti-vibration table for supporting an equipment with the plurality of sensors and controls the actuators on the basis of output signals from the sensors to drive the anti-vibration table, thereby performing an anti-vibration operation for the anti-vibration table, wherein the plurality of sensors are arranged such that, when a motion parameter of the anti-vibration table is represented by a vector P, and an output signal group from the plurality of sensors is represented by a vector S, a condition number of a matrix A defined by an equation S=AP established between the vector P and the vector S in accordance with a geometrical arrangement of the plurality of sensors is minimized.

In the active anti-vibration apparatus of the present invention, a relationship between the vector S having elements $S_1, \ldots,$ and $S_n$ and the vector P having elements $P_x$, $P_y$, and $P\theta_z$ is represented as follows:

$$\begin{bmatrix} S_1 \\ \cdot \\ \cdot \\ \cdot \\ S_n \end{bmatrix} = A \begin{bmatrix} P_x \\ P_y \\ P\theta_z \end{bmatrix}$$

where $S_n$ (n=1 to K (natural number equal to or larger than 2)) are the output signals from the plurality of sensors, $P_x$ is a motion parameter of a motion in an X direction associated with an X-Y plane of the anti-vibration table, $P_y$ is a motion parameter of a motion in a Y direction on the X-Y plane, and $P\theta_z$ is a motion parameter of a rotation motion in a $\theta$ direction on the X-Y plane.

In the active anti-vibration apparatus of the present invention, the plurality of sensors are arranged such that, when the motion parameters $P_x$, $P_y$, and $P\theta_z$ are to be weighted, a condition number of a matrix AW obtained by multiplying the matrix A with a weighting matrix W is minimized.

In the active anti-vibration apparatus of the present invention, the plurality of sensors are arranged such that angles formed by straight lines passing through the sensors and a center of gravity of the anti-vibration table, and motion detection directions of the sensors are substantially equal for the plurality of sensors.

In the active anti-vibration apparatus of the present invention, the sensors comprise three sensors respectively arranged near vertexes of a regular triangle assumed on the X-Y plane.

In the active anti-vibration apparatus of the present invention, the anti-vibration table has a substantially regular triangular structure having vertexes near positions where the three sensors are arranged.

In the active anti-vibration apparatus of the present invention, the actuators are arranged near the vertexes of the anti-vibration table having the substantially regular triangular structure.

In the active anti-vibration apparatus of the present invention, directions of action of the three actuators arranged near the vertexes of the anti-vibration table are substantially the same as the motion detection directions of the sensors arranged near the actuators.

In the active anti-vibration apparatus of the present invention, the actuators are arranged near the plurality of sensors.

In the active anti-vibration apparatus of the present invention, directions of action of the actuators arranged near the vertexes of the anti-vibration table are substantially the same as the motion detection directions of the sensors arranged near the actuators.

According to the present invention, there is provided a method of manufacturing an active anti-vibration apparatus having a plurality of sensors and actuators, which detects a motion of an anti-vibration table for supporting an equipment with the plurality of sensors and controls the actuators on the basis of output signals from the sensors to drive the anti-vibration table, thereby performing an anti-vibration operation for the anti-vibration table, wherein the plurality of sensors are arranged such that, when a motion parameter of the anti-vibration table is represented by a vector P, and an output signal group from the plurality of sensors is represented by a vector S, a condition number of a matrix A defined by an equation S=AP established between the vector P and the vector S in accordance with a geometrical arrangement of the plurality of sensors is minimized.

As described above, the present invention uses, as a quantitative guideline for sensor arrangement, the condition number of a coefficient matrix, which serves as an index representing the degree of influence of an error in equation acting on the translation and rotation motions of the anti-vibration table as the solution of simultaneous equations established between sensor output signals determined by the sensor arrangement and the translation and rotation motions of the anti-vibration table. When the sensor are arranged such that the condition number is minimized, the translation and rotation motions of the anti-vibration table are precisely calculated while minimizing the influence of observation noise.

In addition, the translation and rotation motions as the rigid body motion of the anti-vibration table are weighted, and the sensors are arranged such that the condition number of the matrix as the product of the above coefficient matrix and a weighting matrix is minimized. With this arrangement, considering the difference between the physical dimensions of the translation and rotation motions, or placing importance to the calculation precision of a specific motion, the translation and rotation motions of the anti-vibration table can be precisely calculated while minimizing the influence of observation noise.

According to the present invention, the sensor are arranged such that the condition number of the coefficient matrix is minimized. Therefore, the translation and rotation motions of the anti-vibration table can be highly precisely detected while minimizing the influence of error factors such as observation noise including in sensor output signals or the difference between the nominal value and the true value of a sensor position.

It is still another object of the present invention to provide an active anti-vibration apparatus having a horizontal actuator arrangement for generating equal anti-vibration table driving forces in units of motion modes in any direction of the horizontal motion modes of the anti-vibration table, or generating desired maximum driving forces in any direction of the horizontal motion modes of the anti-vibration table, or a horizontal actuator arrangement for minimizing variations in anti-vibration table driving forces in units of motion modes caused due to variations in actuator thrust or measurement errors of the actuator position.

It is still another object of the present invention to provide a method of manufacturing an active anti-vibration apparatus having a horizontal actuator arrangement for generating equal anti-vibration table driving forces in units of motion modes in any direction of the horizontal motion modes of the anti-vibration table, or generating desired maximum driving forces in any direction of the horizontal motion modes of the anti-vibration table, or a horizontal actuator arrangement for minimizing variations in anti-vibration table driving forces in units of motion modes caused due to variations in actuator thrust or measurement errors of the actuator position.

According to the present invention, there is also provided an active anti-vibration apparatus having a plurality of sensors and actuators, which detects a motion of an anti-vibration table for supporting an equipment with the plurality of sensors and controls the actuators on the basis of output signals from the sensors to drive the anti-vibration table, thereby performing an anti-vibration operation for the anti-vibration table, wherein the plurality of actuators are arranged such that, when thrusts generated by the plurality of actuators are represented by a vector x, and driving forces in units of motion modes, which act on the anti-vibration table, are represented by a vector b, a condition number of a matrix A defined by an equation Ax=b established between the vector x and the vector b in accordance with a geometrical arrangement of the plurality of sensors is minimized.

In the active anti-vibration apparatus of the present invention, the plurality of actuators are arranged such that a condition number of a matrix WA used instead of the matrix A and obtained by multiplying the matrix A with a normalizing matrix W for normalizing the driving forces in units of motion modes, which are represented by the vector b, is minimized.

In the active anti-vibration apparatus of the present invention, the plurality of actuators are arranged such that angles formed by straight lines passing through points of action of thrusts generated by the actuators and a center of gravity of the anti-vibration table or a center of gravity of a structure including the anti-vibration table and support members of the anti-vibration table, and lines of action of the thrusts generated by the actuators with respect to the anti-vibration table become substantially equal for the plurality of actuators.

In the active anti-vibration apparatus of the present invention, the anti-vibration table has a substantially regular triangular structure.

In the active anti-vibration apparatus of the present invention, the plurality of actuators are arranged near vertexes of the anti-vibration table having the substantially regular triangular structure, respectively.

In the active anti-vibration apparatus of the present invention, a relationship between the vector b having elements $F_x$, $F_y$, and $M_z$ and the vector x having elements $F_a$, $F_b$, and $F_c$ is represented as follows:

$$A \begin{bmatrix} F_a \\ F_b \\ F_c \end{bmatrix} = \begin{bmatrix} F_x \\ F_y \\ F_z \end{bmatrix}$$

where $F_x$ is a translation force to be applied in an X-axis direction associated with an X-Y plane of the anti-vibration table, $F_y$ is a translation force to be applied in a Y-axis direction on the X-Y plane, $M_z$ is a moment to be applied to rotation about a Z-axis on the X-Y plane, and $F_a$, $F_b$, and $F_c$ are thrusts to be generated by the plurality of actuators.

In the active anti-vibration apparatus of the present invention, the plurality of sensors are arranged in correspondence with the plurality of actuators.

According to the present invention, there is also provided a method of manufacturing an active anti-vibration apparatus having a plurality of sensors and actuators, which detects a motion of an anti-vibration table for supporting an equipment with the plurality of sensors and controls the actuators on the basis of output signals from the sensors to drive the anti-vibration table, thereby performing an anti-vibration operation for the anti-vibration table, wherein the plurality of actuators are arranged such that, when thrusts generated by the plurality of actuators are represented by a vector x, and driving forces in units of motion modes, which act on the anti-vibration table, are represented by a vector b, a condition number of a matrix A defined by an equation Ax=b established between the vector x and the vector b in accordance with a geometrical arrangement of the plurality of sensors is minimized.

In the active anti-vibration apparatus according to the present invention, the actuators are arranged such that the condition number of a matrix A of a fundamental equation for motion mode distribution given below is minimized, which fundamental equation is determined in accordance with the geometrical arrangement of the actuators and associates the anti-vibration table driving forces $F_x$, $F_y$, and $M_z$ in units of motion modes with the actuator thrusts $F_a$, $F_b$, and $F_c$:

$$\begin{bmatrix} F_x \\ F_y \\ M_z \end{bmatrix} = A \begin{bmatrix} F_a \\ F_b \\ F_c \end{bmatrix}$$

Alternatively, in the anti-vibration apparatus according to the present invention, the actuators are arranged such that the condition number of the matrix WA obtained by multiplying the matrix A with the normalizing matrix W which normalizes the anti-vibration table driving forces $F_x$, $F_y$, and $M_z$ in units of motion modes by desired maximum driving forces $F_{xmax}$, $F_{ymax}$, and $M_{zmax}$ is minimized.

According to the present invention, the actuators are arranged such that the condition number of the matrix A of the fundamental equation for motion mode distribution is minimized. With this arrangement, equal driving forces can be applied to the anti-vibration table in any direction of the horizontal motion modes of the anti-vibration table, so that vibrations of the anti-vibration table can be effectively suppressed. Alternatively, considering the difference between the anti-vibration table driving forces $F_x$, $F_y$, and $M_z$ in units of motion modes and the desired maximum driving forces $F_{xmax}$, $F_{ymax}$, and $M_{zmax}$, the actuators are arranged such that the condition number of the produce WA of the normalizing matrix W for normalizing the driving forces $F_x$, $F_y$, and $M_z$ with the desired maximum driving forces and the matrix A is minimized. With this arrangement, desired maximum driving forces can be applied to the anti-vibration table in any direction of the horizontal motion modes of the anti-vibration table.

In addition, with the actuator arrangement for minimizing the condition number of the matrix A or WA, variations in anti-vibration table driving forces in units of motion modes attributed to variations in actuator thrust or measurement errors of the actuator position can be minimized, so that vibrations of the anti-vibration table can be effectively suppressed.

Further objects, features and advantages of the present invention will be apparent from the following detailed description of embodiments of the present invention with reference to the accompanying drawings.

DETAILED DESCRIPTION OF THE PREFERRED EMBODIMENTS

[First Embodiment]

Figure 1:
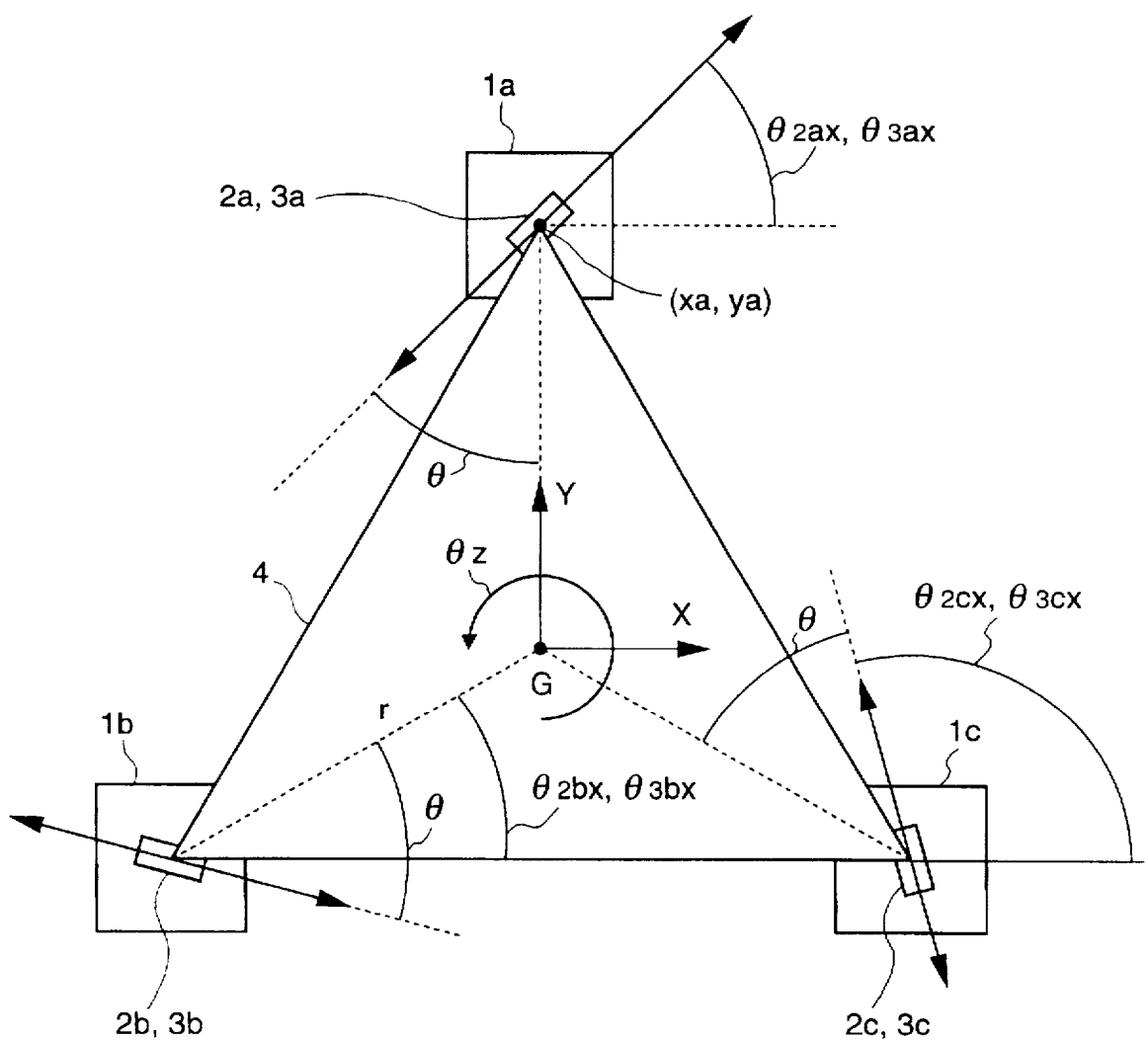
FIG. 1 is a view showing a typical active anti-vibration apparatus according to the first embodiment.

FIG. 1 is a view showing the typical embodiment of an active anti-vibration apparatus according to the present invention, and the arrangement of sensors incorporated in the anti-vibration apparatus. FIG. 1 is a top view of the active anti-vibration apparatus. A support table (to be referred to as an anti-vibration table hereinafter) 4 with a regular triangular structure on which a precision equipment such as the X-Y stage of an exposure apparatus for manufacturing a semiconductor device is mounted is supported at its vertex portions by anti-vibration units 1a to 1c serving as a support mechanism. The anti-vibration units 1a to 1c have sensors 2a to 2c for measuring the motions, including an acceleration, a speed, and a moving amount, of the anti-vibration table 4, and actuators 3a to 3c for applying forces to the anti-vibration table 4, respectively.

A method of optimally arranging the sensors 2a to 2c to precisely measure the horizontal vibration of the anti-vibration table 4, and an anti-vibration apparatus manufactured by this method will be described below. Regarding the anti-vibration table 4 as a rigid body, the horizontal motions of the anti-vibration table 4 are classified into motion modes of total 3-degree-of-freedom constituted by translation motions of the center of gravity in a horizontal plane, which have 2-degree-of-freedom, and a rotation motion about the vertical axis including the center of gravity, which has a single-degree-of-freedom.

The center of gravity of the anti-vibration table 4 is defined as G, and an X-Y-Z coordinate system having its origin at G is fixed on the anti-vibration table. The X-Y plane matches the horizontal plane. In this case, the horizontal motions of the anti-vibration table 4 can be represented by translation motions in the x and Y directions and rotation motion in the $\theta_Z$ direction about the vertical axis (Z-axis) including the center of gravity G. These directions of motions are defined as motion modes of the anti-vibration table 4, and parameters such as the displacement and acceleration of the anti-vibration table in units of motion modes are defined as motion parameters. The horizontal motion modes of the anti-vibration table 4 are X, Y, and $\theta Z$, and motion parameters in units of motion modes are expressed as $P_x$, $P_y$, and $P\theta_z$.

The sensors 2a to 2c can measure mechanical uniaxial rectilinear motions including an acceleration, a velocity, and a moving position. The measurement points of the sensors 2a to 2c are at the vertex positions of the anti-vibration table 4. The measurement direction vectors of the sensors 2a to 2c and the action direction vectors of forces generated by the actuators 3a to 3c are assumed to be in the horizontal plane (X-Y plane) including the center of gravity G. Under these conditions, the arrangement of the sensors 2a to 2c has a single-degree-of-freedom; rotates about the vertical axis passing through the vertexes of the anti-vibration table 4. Since the anti-vibration table 4 has a regular triangular structure, the distance from the center of gravity G to each vertex of the anti-vibration table 4, i.e., the distance from the center of gravity G to each of the sensors 2a to 2c is r.

As shown in FIG. 1, the coordinate point of the sensor 2a on the X-Y coordinate system fixed at the center of gravity G is defined as $(x_a, y_a)$, and the angle formed by the vector from the coordinate point of the sensor 2a in the positive direction along the measurement direction and the X-axis is defined as $\theta_{2ax}$. When the anti-vibration table 4 is in a motion represented by the motion parameters $P_x$, $P_y$, and $P\theta_z$, the output signal from the sensor 2a is $s_a$. In this case, the relationship between the motion parameters and the sensor output signal $s_a$ is represented by the following equation (1):

$$S_a = [\cos\theta_{2ax} \sin\theta_{2ax} x_a\sin\theta_{2ax} - y_a\cos\theta_{2ax}] \begin{bmatrix} P_x \\ P_y \\ P\theta_z \end{bmatrix} \quad (1)$$

As for the sensors 2b and 2c, similarly, the coordinate points of the sensors 2b and 2c on the X-Y coordinate system fixed at the center of gravity G are defined as $(x_b, y_b)$ and $(x_c, y_c)$, respectively, and angles formed by the vectors from these coordinate points in the positive direction along the measurement directions and the X-axis are defined as $\theta_{2bx}$ and $\theta_{2cx}$, respectively. At this time, the relationships between three sensor output signals $s_a$ to $s_c$ and the motion parameters $P_x$, $P_y$, and $P\theta_z$ are represented by linear equation (2) below.

A in equations (2) and (3) below is a coefficient matrix that is determined by the positions of the sensors 2a to 2c and the measurement directions. The coordinates of the sensors 2a to 2c are determined by the radius r of a circle passing through the three vertexes of the anti-vibration table 4, as represented by equation (4) below. Therefore, the coefficient matrix A is expressed as a function of the radius r and the measurement directions of the sensors ($\theta_{2ax}$, $\theta_{2bx}$, and $\theta_{2cx}$). By using linear equation (2) below, the motion parameters $P_x$, $P_y$, and $P\theta_z$ of the anti-vibration table 4 can be obtained from the three sensor output signals $s_a$ to $s_c$.

$$\begin{bmatrix} S_a \\ S_b \\ S_c \end{bmatrix} = A \begin{bmatrix} P_x \\ P_y \\ P\theta_z \end{bmatrix} \quad (2)$$

$$A = \begin{bmatrix} \cos\theta_{2ax} & \sin\theta_{2ax} & x_a\sin\theta_{2ax} - y_a\cos\theta_{2ax} \\ \cos\theta_{2bx} & \sin\theta_{2bx} & x_b\sin\theta_{2bx} - y_b\cos\theta_{2bx} \\ \cos\theta_{2cx} & \sin\theta_{2cx} & x_c\sin\theta_{2cx} - y_c\cos\theta_{2cx} \end{bmatrix} \quad (3)$$

$$(x_a, y_a) = \left[ r\cos\left(\frac{\pi}{2}\right), r\sin\left(\frac{\pi}{2}\right) \right] \quad (4)$$

$$(x_b, y_b) = \left[ r\cos\left(-\frac{5}{6}\pi\right), r\sin\left(-\frac{5}{6}\pi\right) \right]$$

$$(x_c, y_c) = \left[ r\cos\left(-\frac{90}{6}\right), r\sin\left(-\frac{\pi}{6}\right) \right]$$

As a method of controlling the active anti-vibration apparatus, closed control loops are formed by the sensors 2a to 2c and the actuators 3a to 3c incorporated in the anti-vibration units 1a to 1c, respectively, thereby independently controlling the respective anti-vibration units. Alternatively, control loops are formed in units of motion modes of the anti-vibration table 4. In this case, the motion parameters of the anti-vibration table 4 are measured from sensor information to determine the operating forces to be applied to the anti-vibration table 4 in units of motion modes. The actuators 3a to 3c are driven to realize the operating forces in units of motion modes.

To measure the motion modes of the anti-vibration table 4 from sensor information, equation (2) above is used. Solving linear simultaneous equations represented by equation (2) yields, the motion parameters $P_x$, $P_y$, and $P\theta_z$. Since the left-hand side member of equation (2) represents output signals from the sensors 2a to 2c, it includes measurement noise. As for the coefficient matrix A determined by the sensor arrangement as well, an error may be present.

To quantitatively evaluate the influence of the error included in the observation data, which affects the solution, i.e., the motion parameters, the condition number of the coefficient matrix A must be checked. The condition number is a positive number and its minimum value is 1. When the condition number is large (bad condition), the solution, i.e., the motion parameters largely change due to a small difference in sensor output signals. Alternatively, a small error between the measured values and the true values of the sensor positions and directions largely degrades the reliability of the solution, i.e., the motion parameters. When the condition number becomes infinitely large, a drop in rank occurs in the coefficient matrix A. That is, the motion parameters cannot be obtained.

When the sensors 2a to 2c are arranged to set the condition number as close to 1 (best condition) as possible, an optimum sensor arrangement for measuring the motion parameters can be realized. This sensor arrangement also allows to most easily measure the horizontal motions of 3-degree-of-freedom of the anti-vibration table 4. Therefore, the optimum sensor arrangement for measuring the motion parameters in control of the anti-vibration table 4 in units of motion modes can also be optimally applied to independently control the anti-vibration units.

As described above, when the measurement directions of the sensors 2a to 2c are determined such that the condition number of the coefficient matrix A of equation (3) is minimized, an optimum sensor arrangement is obtained. The condition number can be used as a quantitative guideline for the sensor arrangement.

FIG. 1 shows the sensor arrangement for minimizing the condition number. The straight line in the measurement direction of each of the sensors 2a to 2c and a line connecting each vertex of the anti-vibration table 4 at which the sensor is positioned to the center of gravity G form the same acute angles $\theta$. The sensors are arranged such that the acute angle is formed on the left side of the line from the center of gravity G to the vertex.

Figure 2:
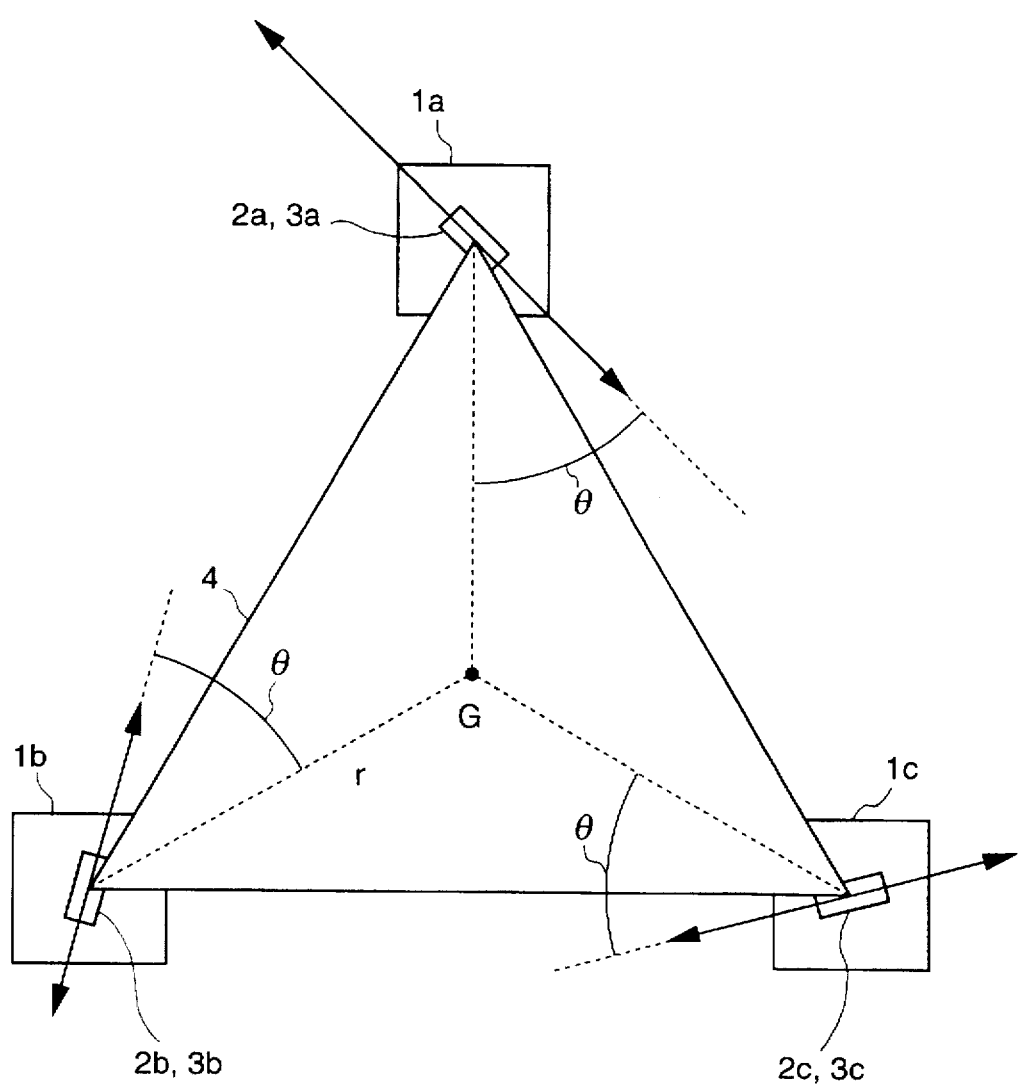
FIG. 2 is a view showing a modification of the embodiment shown in FIG. 1.

As shown in FIG. 2, the condition number can also be minimized with a sensor arrangement in which the same acute angle $\theta$ is formed on the right side of the line from the center of gravity G to the vertex of the anti-vibration table 4. Only the arrangements shown in FIGS. 1 and 2 can minimize the condition number of the coefficient matrix A of equation (3). The sensor angle $\theta$ is uniquely determined within the range from 0° to 90° in accordance with the radius r of the anti-vibration table 4. Each arrow in FIG. 1 or 2, which extends through the sensor, indicates the positive direction of the sensor measurement direction. The sensor measurement direction may be set in any direction as far as it is parallel to the straight line having the angle $\theta$ with respect to the line connecting the vertex of the anti-vibration table 4 to the center of gravity G.

Figure 3:
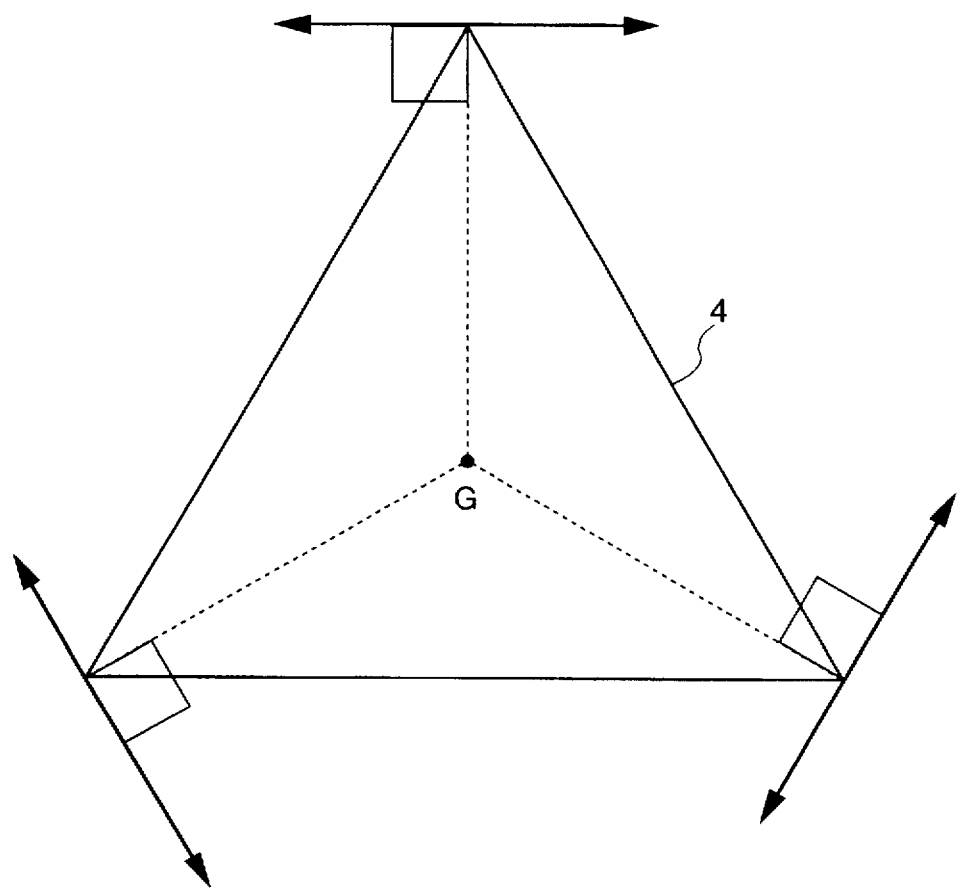
FIG. 3 is a view showing a sensor arrangement for most easily measuring a rotation motion.
Figure 4:
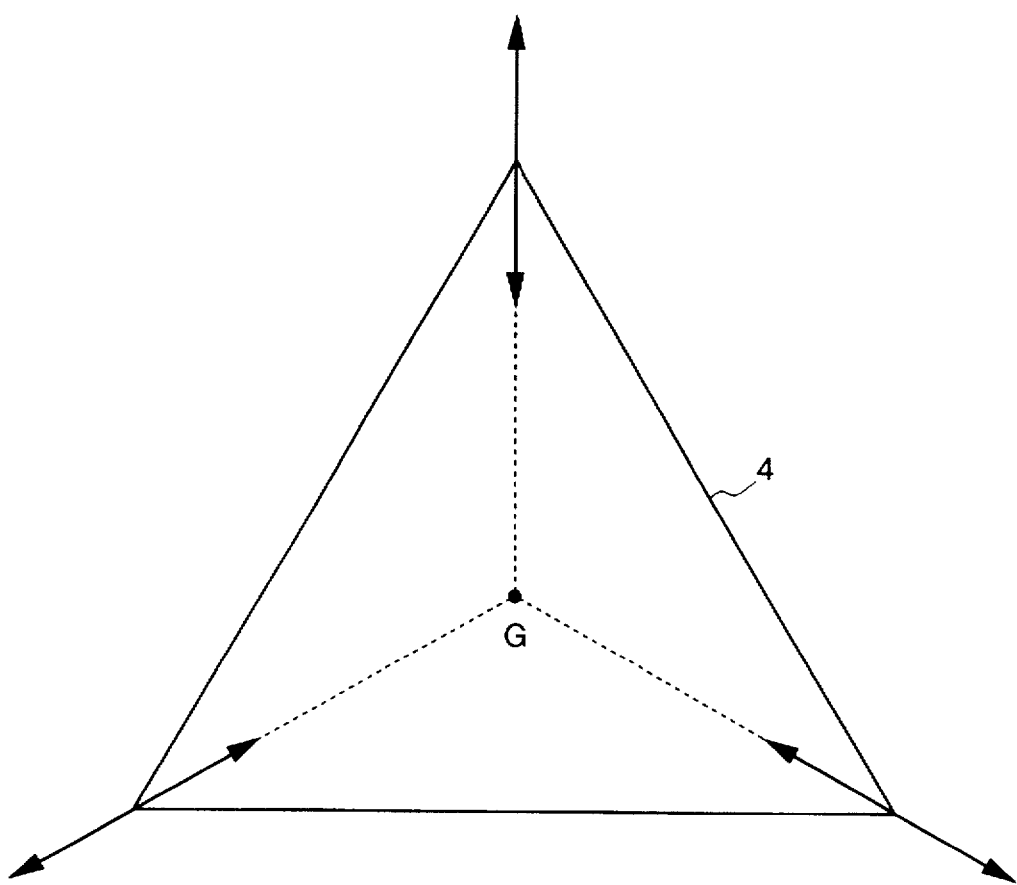
FIG. 4 is a view showing a sensor arrangement for most easily measuring a translation motion.

To minimize the condition number of the matrix A, the apparent fact that the sensor angle $\theta$ increases as the radius r becomes smaller must be considered. A sensor arrangement for most easily detecting the rotation motion in the $\theta_Z$ direction is an arrangement along the direction (circumferential direction) perpendicular to the line connecting the center of gravity to the vertex, as shown in FIG. 3. To the contrary, a sensor arrangement for most easily detecting the X- and Y-direction translation motions is an arrangement along the direction toward the center of gravity G (radial direction), as shown in FIG. 4. As the radius r of the anti-vibration table 4 becomes smaller, detection of the rotation motion in the $\theta_z$ direction becomes more difficult. Therefore, the sensors 2a to 2c must be set close to the circumferential direction. That is, the sensor angle θ increases. As described above, the sensor arrangement for minimizing the condition number of the coefficient matrix A changes depending on the radius r.

For example, when the radius r=1, the condition number of the matrix A of equation (2) is minimized with a sensor angle θ=45°. This is, the middle direction between the circumferential direction and the radial direction. In this case, the condition number is 1.

In the embodiment shown in FIGS. 1 and 2, the action directions of the actuators 3a to 3c are set in the same direction as the measurement directions of the sensors 2a to 2c, respectively. With this arrangement, both methods of controlling the active anti-vibration apparatus, i.e., a method of forming control loops in units of motion modes of the anti-vibration table 4 and a method of forming closed control loops in units of anti-vibration units, can be realized.

In equation (2) as a fundamental equation for calculating the optimum sensor arrangement in the above embodiment, the physical dimensions of the motion parameters $P_x$, $P_y$, and $P\theta_z$ are different. The dimension of the translation parameters $P_x$ and $P_y$ is different from that of the rotation parameter $P\theta_z$. In the above arrangement, the optimum sensor arrangement is calculated by equally handling quantities with different physical dimensions. When the motion parameters are represented by using the unit of length [m] and the unit of rotation [rad], and the actual motion of the anti-vibration table 4 can be represented by the translation parameters $P_x$ and $P_y$ and the rotation parameter $P\theta_z$, all of which have the close value, equation (2) can be used as a fundamental equation.

Otherwise, weighting is needed between the translation parameters and the rotation parameters. In addition, even when the measurement precision for the remaining parameters are sacrificed to some extent to precisely measure a specific motion parameter, the motion parameters must be weighted. Equations (5) and (6) below are used as fundamental equations for obtaining an optimum sensor arrangement in consideration of weighting between the motion parameters:

$$\begin{bmatrix} S_a \\ S_b \\ S_c \end{bmatrix} = AW \begin{bmatrix} P_x \\ P_y \\ P\theta_z \end{bmatrix} \quad (5)$$

$$W = \begin{bmatrix} 1/w_x & 0 & 0 \\ 0 & 1/w_y & 0 \\ 0 & 0 & 1/w_{\theta_z} \end{bmatrix} \quad (6)$$

The sensor arrangement for minimizing the condition number of a coefficient matrix AW of simultaneous linear equations (5) and (6) above is an optimum sensor arrangement. To weight the parameters, a weighting value $w_i$ (i=x, y, or θz) of a motion mode to be precisely measured is set to be large. Assuming that the motion of the anti-vibration table 4 is represented in units of motion modes, when the motion parameters $P_x$, $P_y$, and $P\theta_z$ have the close value, and all the motion parameters are to be measured at the same precision, the same weighting value is used ($w_x=w_y=w\theta_z=1$).

When the weighting values $w_x$ and $w_y$ of the translation motion parameters $P_x$ and $P_y$ are the same value, the three sensors 2a to 2c are set in the direction of angle θ with respect to the lines connecting the vertexes of the anti-vibration table 4, where the sensors 2a to 2c are positioned, to the center of gravity G, as in the above embodiment.

Figure 5A:
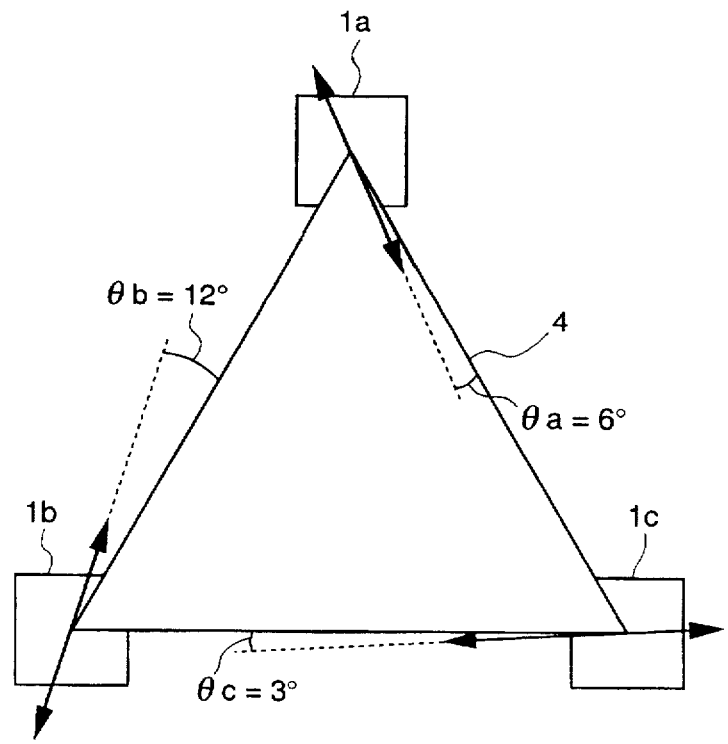
FIGS. 5A and 5B are views showing other arrangements of the first embodiment, which place importance to the measurement precision of the Y-direction translation motion.
Figure 5B:
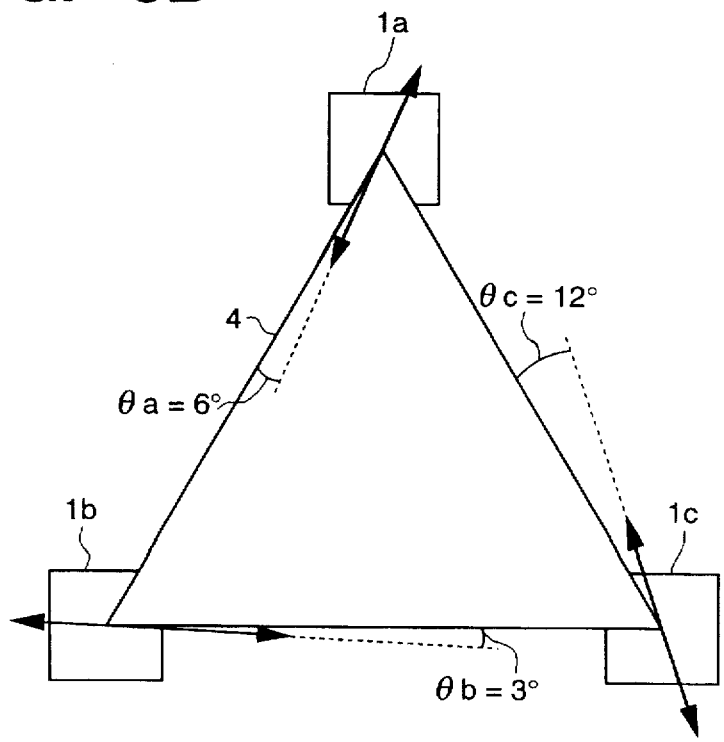

The value of the sensor angle θ changes depending on the ratio of the weighting value $w_x$ (=$w_y$) to the weighting value $w\theta_z$ and the radius r of the anti-vibration table 4. When the weighting values $w_x$ and $w_y$ are different, the three sensors 2a to 2c are set at different sensor angles. For example, the optimum sensor arrangement placing importance to the precision of the Y-direction translation motion parameter $P_y$ is shown. This arrangement is calculated while setting the weighting values $w_y=2$ and $w_x=w\theta_z=1$ and the radius r of the anti-vibration table 4=1. Two sensor arrangements shown in FIGS. 5A and 5B are obtained as an arrangement for minimizing the condition number of the coefficient matrix AW. Since the measurement precision in the Y direction is given importance, the sensor measurement direction becomes close to the Y direction.

In the above embodiment, an anti-vibration operation for the anti-vibration table with a three-point support mechanism and horizontal motions of 3-degree-of-freedom has been described. However, the present invention which minimizes the condition number of a coefficient matrix in simultaneous equations that associate the motion parameters with sensor signal outputs is not limited to the anti-vibration table with the three-point support mechanism and is not limited to the horizontal motions of 3-degree-of-freedom, either. The present invention can be applied to any case of arrangement of sensors which are the same in number as the motion parameters to be calculated.

As described above, according to the anti-vibration apparatus of the present invention, the vibration of the anti-vibration table with, e.g., horizontal motions of 3-degree-of-freedom can be precisely calculated by the vibration sensors incorporated in the anti-vibration apparatus serving as a support mechanism while minimizing the influence of observation noise. In addition, a quantitative guideline for the sensor arrangement can be provided.

In addition, according to the method of arranging the sensors of the anti-vibration apparatus of the present invention, an anti-vibration apparatus which can precisely calculate the vibration of an anti-vibration table with, e.g., horizontal motions of 3-degree-of-freedom by using vibration sensors incorporated in the anti-vibration table serving as a support mechanism while minimizing the influence of observation noise, can be manufactured.

[Second Embodiment]

Figure 10:
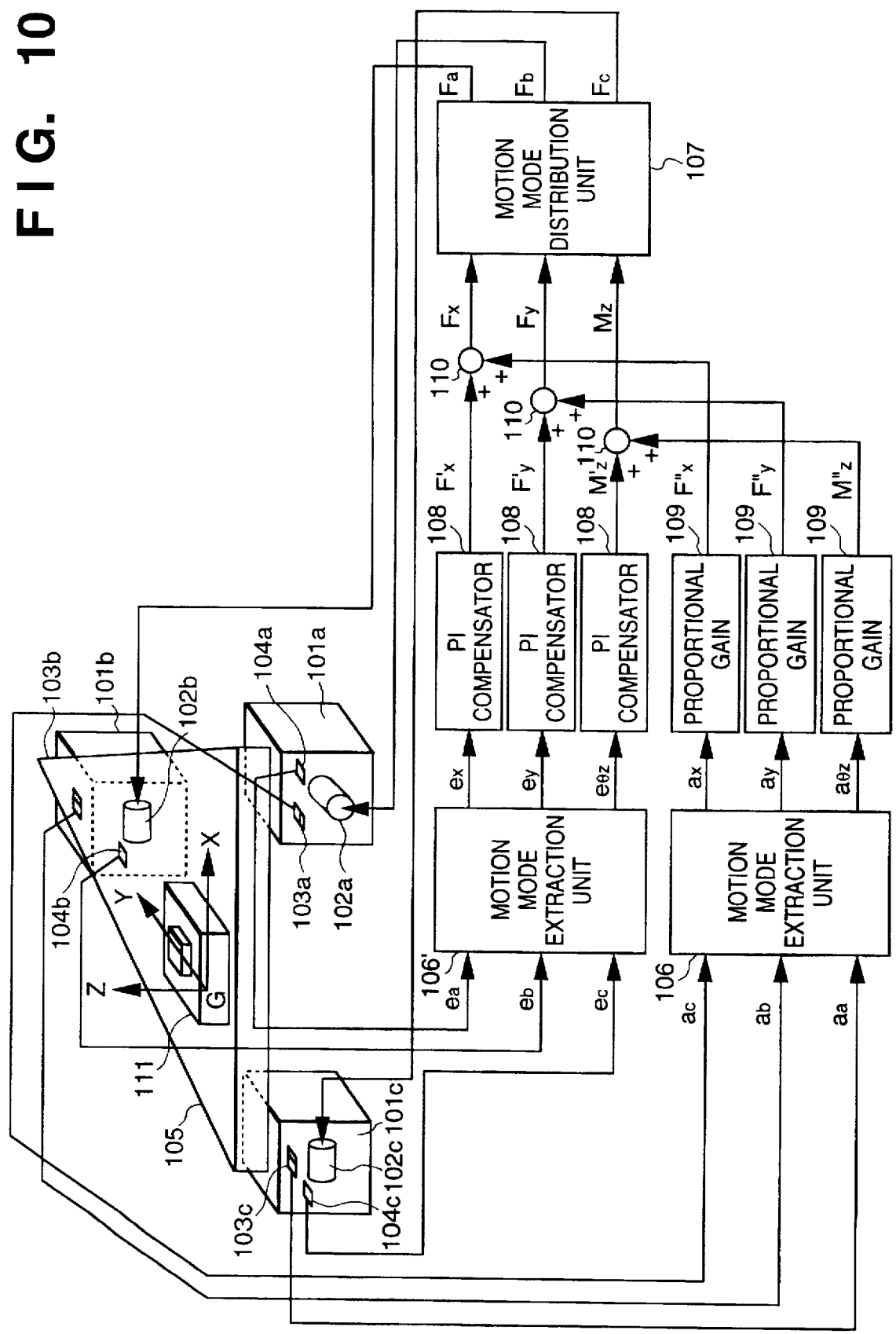
FIG. 10 is a view showing the overall arrangement of an active anti-vibration apparatus.

Anti-vibration table driving forces in units of motion modes as inputs to a motion mode distribution unit 107 in FIG. 10 are defined as b, and actuator thrusts as outputs are defined as x. Note that b and x are vector quantities. With the arrangement of the active anti-vibration apparatus in FIG. 10, b and x are represented by the following equations (7) and (8), respectively:

$$b = [F_x \; F_y \; F_z]^T \quad (7)$$
$$X = [F_a \; F_b \; F_c]^T \quad (8)$$

T on the right-hand side of equations (7) and (8) represents transposition of a matrix. The relationship between b and x is represented by equation (9) below in accordance with the arrangement of actuators 102a to 102c with respect to the center of gravity of an anti-vibration table 105:

$$Ax = b \quad (9)$$

A matrix A multiplied with x on the left-hand side of equation (9) is a constant matrix determined by the arrangement of the actuators 102a to 102c. Equation (9) is a fundamental equation for motion mode distribution. To apply desired driving forces b in units of motion modes to the anti-vibration table 105, actuator thrusts x as a solution of equation (9) must be generated by the actuators 102a to 102c.

If the matrix A has an inverse matrix, the solution of equation (9) is obtained. Normally, the actuators 102a to 102c are arranged such that the solution of equation (9) is present. In fact, since the thrust generated by an actuator is finite, the anti-vibration table driving forces b in units of motion modes which can be realized are also limited. To effectively suppress the vibration of the anti-vibration table 105, elements $F_x$, $F_y$, and $M_z$ of the anti-vibration table driving forces b in units of motion modes are preferably equally realizable. For this purpose, the actuators 102a to 102c must be arranged such that the condition number of the matrix A of equation (9) is minimized. This will be described below.

When the actuator thrust x satisfies a constraint as represented by equation (10) below, the anti-vibration table driving forces b in units of motion modes which can be realized from x form an elliptical body represented by equation (11) below in a three-dimensional space defined by $F_x$, $F_y$, and $M_z$. This is apparent from equation (12) below:

$$|X| = \sqrt{F_a^2 + F_b^2 + F_c^2} \leq 1 \tag{10}$$

$$b^T(A^{-1})^T A^{-1} b \leq 1 \tag{11}$$

$$|X|^2 = X^T X = b^T(A^{-1})^T A^{-1} b \leq 1 \tag{12}$$

The principal axis of the elliptical body of equation (11) and the length of the principal axis are obtained by singular point degeneration of the matrix A. Assume that singular point degeneration of the matrix A is represented by the following equations (13) and (14):

$$A = U S T^T \tag{13}$$

$$S = \begin{bmatrix} \sigma_1 & 0 & 0 \\ 0 & \sigma_2 & 0 \\ 0 & 0 & \sigma_3 \end{bmatrix} \tag{14}$$

Since the matrix A has an inverse matrix, $\sigma_1 \geq \sigma_2 \geq \sigma_3$. When the vector of the ith row of U is defined as $u_i^T$, the principal axis of the elliptical body is given by $\sigma_1 u_1$, $\sigma_2 u_2$, and $\sigma_3 u_3$. When orthogonal transformation as represented by equation (15) below is considered for b, equation (16) below is obtained from equations (11) and (15):

$$\tilde{b} = U^T b = [u_1 u_2 u_3] b \tag{15}$$

$$b^T(A^{-1})^T A^{-1} b = \tilde{b}^T \begin{bmatrix} \frac{1}{\sigma_1^2} & 0 & 0 \\ 0 & \frac{1}{\sigma_2^2} & 0 \\ 0 & 0 & \frac{1}{\sigma_3^2} \end{bmatrix} \tilde{b} \leq 1 \tag{16}$$

As is apparent from equation (16), the direction of coordinate axis for $\tilde{b}$, i.e., $u_1$, $u_2$, and $u_3$ indicates the direction of principal axis of the elliptical body, and the radii in this direction are $\sigma_1$, $\sigma_2$, and $\sigma_3$.

In the three-dimensional space of the anti-vibration table driving forces $F_x$, $F_y$, and $M_z$ in units of motion modes, a large driving force can be applied to the anti-vibration table 105 along the direction of the long radius of the principal axis of the elliptical body. However, only a small driving force can be applied along the direction of the short radius. Therefore, to generate equal $F_x$, $F_y$, and $M_z$, the elliptical body is preferably close to a sphere. Of the radii of principal axis of the elliptical body, the longest is $\sigma_1$, and the shortest is $\sigma_2$. For this reason, when the ratio of $\sigma_1$ to $\sigma_3$, i.e., $\sigma_1/\sigma_3$ comes close to 1, the elliptical body becomes close to a sphere. The ratio $\sigma_1/\sigma_3$ is defined as the condition number of the matrix A. As the condition number of the matrix A becomes smaller, the elliptical body becomes close to a sphere.

In the above description, the actuator thrust x is assumed to satisfy the constraint that the sum of squares of the elements of x is smaller than 1, as is represented by equation (10). However, as represented by equation (17) below, it is more practical to consider a constraint that limits the maximum thrusts as the elements of x, which can be generated by the respective actuators:

$$|F_a|, |F_b|, |F_c| \leq 1 \tag{17}$$

Figure 9:
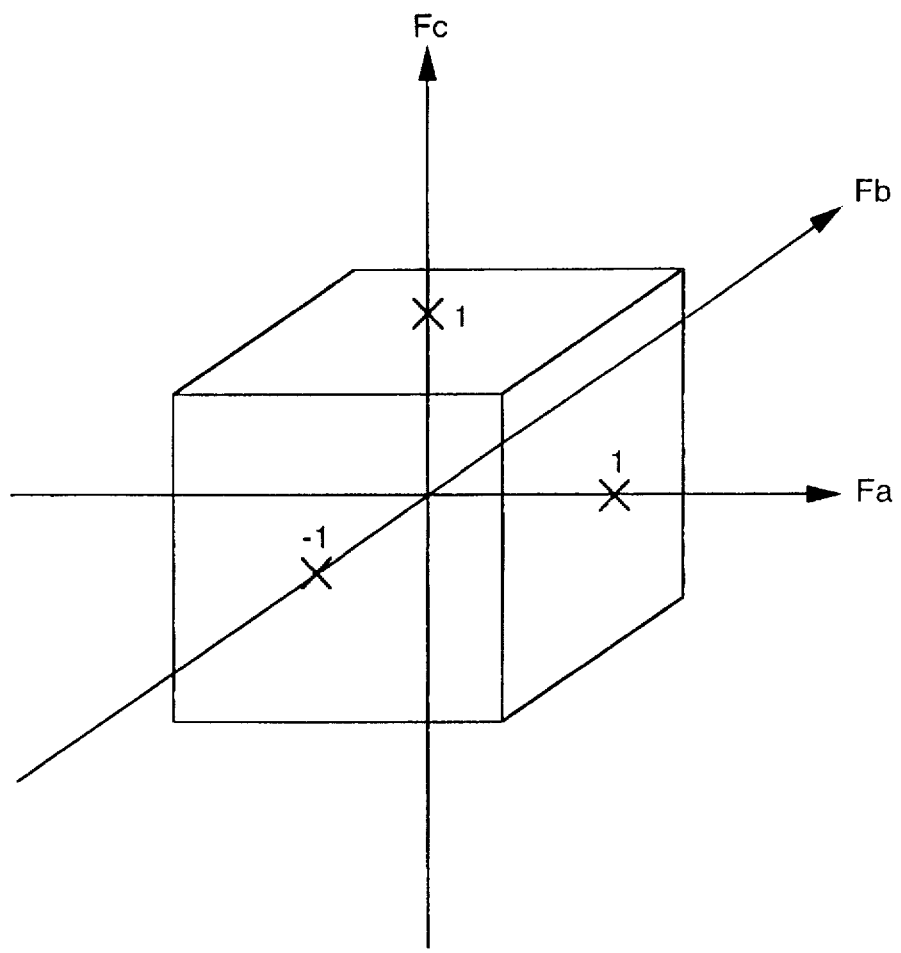
FIG. 9 is a view showing the constraint of the actuator thrust.

Equation (17) forms a cube as shown in FIG. 9 in a three-dimensional space defined by $F_a$, $F_b$, and $F_c$. Equation (10) represents a sphere inscribed with the respective planes of the cube shown in FIG. 9. When a constraint as represented by equation (17) is given to x, the anti-vibration table driving forces b in units of motion modes which can be realized from x form a hexahedron in the three-dimensional space defined by $F_x$, $F_y$, and $M_z$. As the condition number of the matrix A becomes close to 1, this hexahedron becomes close to a cube. Therefore, even when the constraint as represented by equation (17) is considered, all of $F_x$, $F_y$, and $M_z$ equal can be generated as the condition number of the matrix A becomes smaller.

In the above description, the difference between physical dimensions of the translation thrusts $F_x$ and $F_y$ and the moment $M_z$ has been ignored. Depending on the driving conditions for an equipment mounted on the anti-vibration table 105, a larger driving force must be generated as one of $F_x$, $F_y$, and $M_z$ in some cases. To handle the thrusts and the moment placing equal weight on them and to give consideration to the difference between the desired maximum driving forces $F_x$, $F_y$, and $M_z$, $F_x$, $F_y$, and $M_z$ can be normalized, as will be described below. The desired maximum driving forces are defined as $F_{xmax}$, $F_{ymax}$, and $M_{zmax}$, and the normalized anti-vibration table driving forces $\hat{b}$ in units of motion modes are defined as represented by the following equations (18) and (19):

$$\hat{b} = W b \tag{18}$$

$$W = \begin{bmatrix} \frac{1}{F_{xmax}} & 0 & 0 \\ 0 & \frac{1}{F_{ymax}} & 0 \\ 0 & 0 & \frac{1}{F_{zmax}} \end{bmatrix} \tag{19}$$

Substituting equation (18) into equation (9) yields the following equation (20):

$$W A x = \hat{b} \tag{20}$$

To consider weighting between $F_x$, $F_y$, and $M_z$, the actuators 102a to 102c are arranged such that the condition number of matrix WA of equation (20) is minimized. $F_{xmax}$, $F_{ymax}$, and $M_{zmax}$ need not be values having physical dimensions and can be relative ratios as dimensionless quantities.

Generally, an actuator does not always generate a thrust corresponding to a command value from a controller. Some variations in thrust due to a factor such as a torque ripple cannot be avoided. In addition, to obtain the matrix A of equation (9), it is essential to determine the positional relationship between a center of gravity G of the anti-vibration table 105 and the actuators 102a to 102c. However, it is difficult to accurately measure the positions of the actuators in fact, and some errors between the measured value and the true value cannot be avoided. To quantitatively evaluate the error between the desired driving forces and the anti-vibration table driving forces in units of motion modes actually acting on the anti-vibration table 105, which is produced due to variations in actuator thrust or measurement errors of the actuator position, the condition number of the matrix A of equation (9) must be checked.

In the linear equation such as equation (9), the condition number of the matrix A indicates the sensitivity of the solution x with respect to an error included in A and b. As the condition number becomes larger, the solution x largely changes with respect to a fine variation in A and b. Using an inverse matrix $A^{-1}$ of the matrix A, equation (9) is represented by the following equation (21):

$$A^{-1}b = x \tag{21}$$

The condition number of the matrix A is the same as that of the inverse matrix $A^{-1}$. Regarding equation (21) as a new linear equation replacing equation (9), the condition number of the matrix A indicates the sensitivity coefficient representing the influence of an error included in $A^{-1}$ and x on b. More specifically, the condition number of the matrix A becomes a sensitivity coefficient representing the error between the desired driving forces and the anti-vibration table driving forces in units of motion modes acting on the anti-vibration table 105, which is generated due to variations in actuator thrust or measurement errors of the actuator position. When the condition number is smaller, desired anti-vibration table driving forces in units of motion modes can be applied to the anti-vibration table without any influence of error factors. Therefore, to minimize the influence of error factors, the actuators 102a to 102c must be arranged such that the condition number of the matrix A is minimized. Similarly, when the anti-vibration table driving forces $F_x$, $F_y$, and $M_z$ in units of motion modes are normalized, the actuators 102a to 102c must be arranged such that the condition number of the matrix WA of equation (20) is minimized.

As described above, when the actuators 102a to 102c are arranged such that the condition number of the matrix A of equation (9) as the fundamental equation for motion mode distribution, or the product WA of the matrix A and the weighting matrix W is minimized, equal anti-vibration table driving forces $F_x$, $F_y$, and $M_z$ in units of motion modes, or desired maximum driving forces can be applied to the anti-vibration table. In addition, any error between the desired driving forces and the anti-vibration table driving forces in units of motion modes, which is produced due to variations in actuator thrust or measurement errors of the actuator position, can be minimized.

Figure 6:
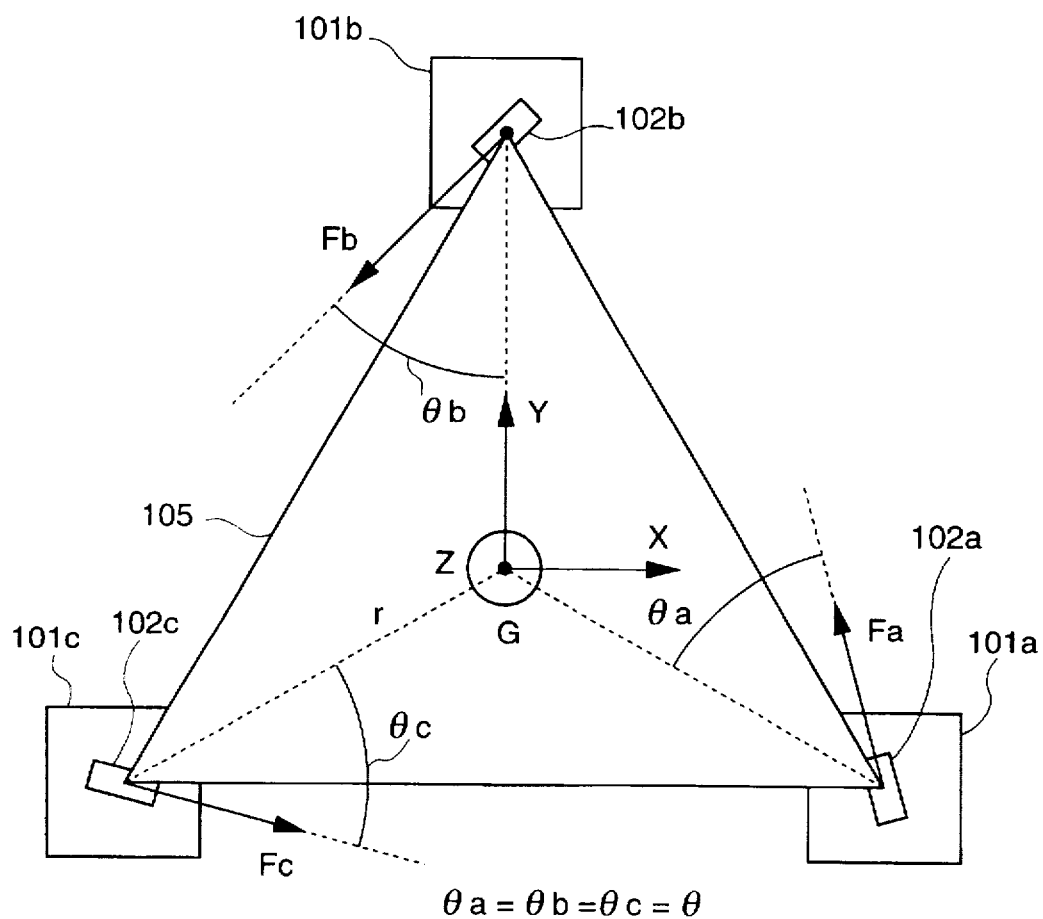
FIG. 6 is a view showing a typical active anti-vibration apparatus according to the second embodiment.

FIG. 6 is a view showing a typical arrangement of the present invention. FIG. 6 is a view of anti-vibration units 101a to 101c and the anti-vibration table 105, which are viewed from the top. The anti-vibration table 105 with a regular triangular structure is supported at its vertex portions by the anti-vibration units 101a to 101c. The anti-vibration units 101a to 101c have the actuators 102a to 102c for applying driving forces to the anti-vibration table 105, respectively. The lines of action of thrusts generated by the actuators pass through the vertexes of the anti-vibration table 105 and are in a horizontal plane including the center of gravity G of the anti-vibration table 105.

The X-Y-Z coordinate system has its Z-axis along the vertical direction such that the origin matches the center of gravity G of the anti-vibration table 105. In addition, the X-Y-Z coordinate system is fixed on the anti-vibration table 105 while setting its X-axis parallel to the base of the anti-vibration table 105 viewed from the top as in FIG. 6.

Referring to FIG. 6, the arrangement of the actuators 102a to 102c has a single-degree-of-freedom; rotates about the vertical axis passing through the vertexes of the anti-vibration table 105. The angle of rotation is represented by angles $\theta_a$, $\theta_b$, and $\theta_c$ formed by lines connecting the respective vertexes to the center of gravity G and the lines of action of thrusts generated by the actuators. The distance from each vertex to the center of gravity G is defined as r. At this time, equations (22) to (24) below are obtained as fundamental equations for motion mode distribution in correspondence with equation (9):

$$\begin{bmatrix} F_x \\ F_y \\ M_z \end{bmatrix} = A(r, \theta_a, \theta_b, \theta_c) \begin{bmatrix} F_a \\ F_b \\ F_c \end{bmatrix} \tag{22}$$

$$A = \begin{bmatrix} \cos\theta'_a & \cos\theta'_b & \cos\theta'_c \\ \sin\theta'_a & \sin\theta'_b & \sin\theta'_c \\ \frac{\sqrt{3}}{2} r \cdot \sin\theta'_a + \frac{r}{2} \cos\theta'_a & -r \cdot \cos\theta'_b & -\frac{\sqrt{3}}{2} r \cdot \sin\theta'_c + \frac{r}{2} \cos\theta'_c \end{bmatrix} \tag{23}$$

$$\theta'_a = \frac{5}{6}\pi - \theta_a$$

$$\theta'_b = \frac{-1}{2}\pi - \theta_b \tag{24}$$

$$\theta'_c = \frac{1}{6}\pi - \theta_c$$

Figure 7:
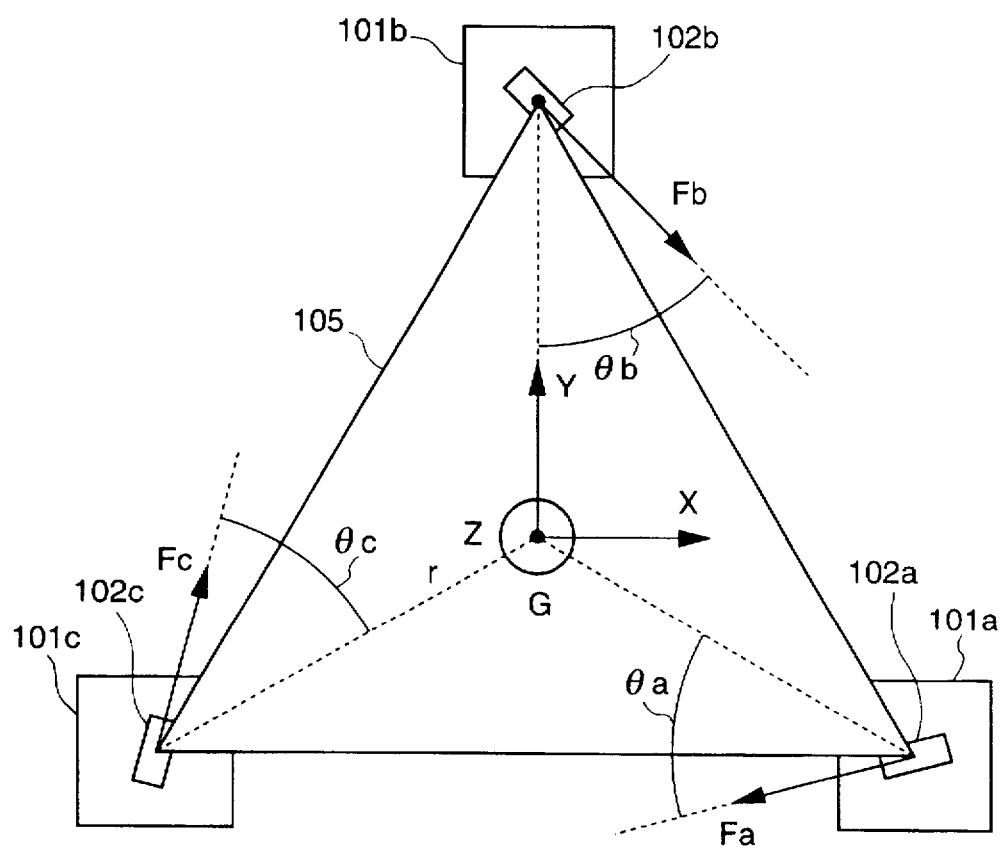
FIG. 7 is a view showing a modification of the embodiment shown in FIG. 6.

FIG. 6 shows the arrangement of the actuators 102a to 102c for minimizing the condition number of the matrix A of equation (22). The lines of action of thrusts generated by the actuators 102a to 102c and the lines connecting the respective vertexes of the anti-vibration table 105 to the center of gravity G form the same acute angles $\theta$ ($\theta_a = \theta_b = \theta_c$). The acute angles $\theta$ do not oppose each other along the respective sides of the anti-vibration table 105 with the triangle structure. FIG. 7 also shows an arrangement for satisfying the above conditions. Only the actuator arrangements shown in FIGS. 6 and 7 can minimize the condition number of the matrix A of equation (22). Depending on the distance r, the angle $\theta$ is uniquely determined within the range of 0° to 90°. As the distance r becomes smaller, the angle θ becomes larger. This is because, when the actuators 102a to 102c come closer to the center of gravity G of the anti-vibration table 105, hardly any moment $M_z$ is generated about the Z-axis. For example, when r=1, the condition number of the matrix A is minimized at θ=45°. The minimum value is 1.

When the difference between the desired driving forces $F_x$, $F_y$, and $M_z$ is taken into consideration, the actuators 102a to 102c are arranged such that the condition number of the product WA of the normalizing matrix W of equation (19) and the matrix A is minimized. When the desired maximum values $F_{xmax}$ and $F_{ymax}$ of the translation thrusts $F_x$ and $F_y$ have the same value, the lines of action of thrusts generated by the actuators 102a to 102c are set in directions forming the same angles θ with respect to the lines connecting the respective vertexes of the anti-vibration table 105 to the center of gravity G. The angle θ changes in accordance with the ratio of $F_{xmax}$ ($=F_{ymax}$) to $M_{zmax}$ and the distance r. As $M_{zmax}$ is set to be larger, and as r is set to be smaller, the angle θ becomes larger. When $F_{xmax}$ is different from $F_{ymax}$, the angles $θ_a$, $θ_b$, and $θ_c$ are different.

Figure 8A:
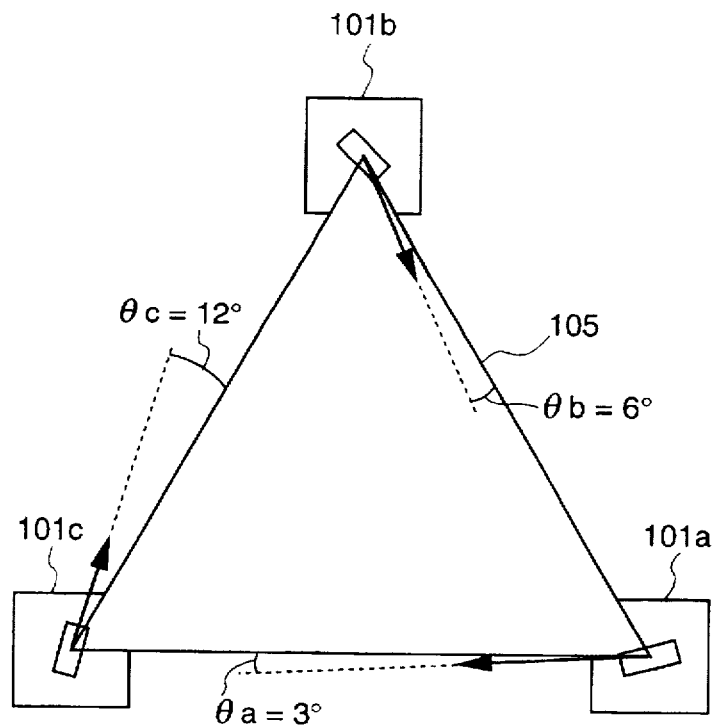
FIGS. 8A and 8B are views showing other arrangements of the second embodiment, which place importance to the maximum translation thrust in the Y direction.
Figure 8B:
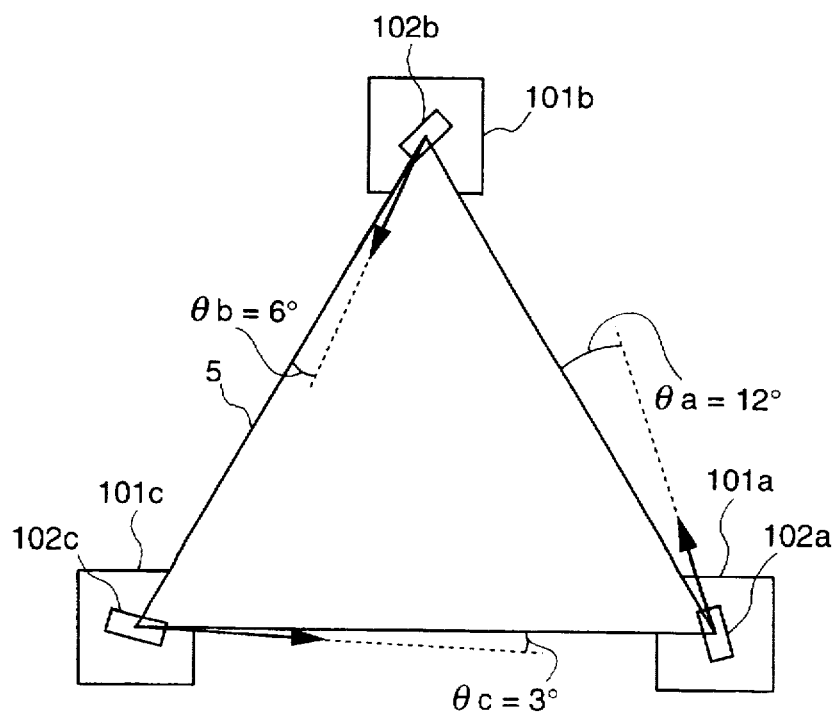

In a scan type exposure apparatus, the stage mounted on the anti-vibration table is mainly driven in the scanning direction. For this reason, it is required to apply a large driving force to the anti-vibration table along the scanning direction. FIGS. 8A and 8B show actuator arrangements for applying in the Y-axis direction a translation thrust twice that in the X-axis direction assuming that the scanning operation is performed along the Y-axis direction. $F_{xmax}$, $F_{ymax}$, and $M_{zmax}$ may not be actual desired maximum driving forces but may be relative ratios as dimensionless quantities. When $F_{xmax}=1$, $F_{ymax}=2$, $M_{zmax}=1$, and r=1, the condition number of the matrix WA is minimized with the arrangement of the actuators 102a to 102c as in FIG. 8A or 8B. Since $F_{ymax}$ is set to be large, the actuator 102b points in the Y-axis direction, unlike that in FIGS. 6 and 7. As described above, according to the present invention, the actuators can be arranged while placing importance to the vibration damping performance in a specific direction, a large vibration damping effect can be obtained as an anti-vibration apparatus for a scan type exposure apparatus.

In the above arrangement, an anti-vibration table with an regular triangular structure has been described. However, the present invention which arranges the actuators such that the condition number of the matrix A or WA is minimized is not limited to an anti-vibration table with a regular triangular structure. The present invention can be applied to any actuator arrangement in the horizontal direction as far as the anti-vibration table is supported by three anti-vibration units.

In addition, the center of gravity G may be either the center of gravity of the anti-vibration table 105 itself or the center of gravity of the entire structure including the anti-vibration table 105 and the support members therefor.

As has been described above, according to the present invention, equal driving forces can be applied to the anti-vibration table in any direction of the horizontal motion modes of the anti-vibration table. In addition, desired maximum driving forces can be applied to the anti-vibration table in any direction of the horizontal motion modes of the anti-vibration table. Furthermore, a variation in anti-vibration table driving forces in units of motion modes, which is attributed to a variation in actuator thrust or measurement error of the actuator position, can be minimized. With this arrangement, the vibration of the anti-vibration table can be effectively suppressed.

The present invention is not limited to the above embodiments and various changes and modifications can be made within the spirit and scope of the present invention. Therefore, to apprise the public of the scope of the present invention, the following claims are made.

What is claimed is:

1. An active anti-vibration apparatus having a plurality of sensors and actuators, which detects motion of an anti-vibration table for supporting an equipment with said plurality of sensors and controls said actuators on the basis of output signals from said sensors to drive said anti-vibration table, thereby performing an anti-vibration operation for said anti-vibration table, wherein said plurality of sensors are arranged such that, when a motion parameter of said anti-vibration table is represented by a vector P, and an output signal group from said plurality of sensors is represented by a vector S, a condition number of a matrix A defined by an equation S=AP established between the vector P and the vector S in accordance with a geometrical arrangement of said plurality of sensors is minimized.

2. An active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, wherein said plurality of sensors are arranged such that, when a motion parameter of said anti-vibration table is represented by a vector P, and an output signal group from said plurality of sensors is represented by a vector S, a condition number of a matrix A is defined by an equation S=AP established between the vector P and the vector S in accordance with a geometrical arrangement of said plurality of sensors, and a matrix W represents weight elements of the vector P, a condition number of a matrix AW obtained by multiplying the matrix A with the matrix W is minimized, and wherein a relationship between the vector S having elements $S_1, \ldots, S_n$ and the vector P having elements $P_x$, $P_y$, and $Pθ_z$ is represented as follows:

$$\begin{bmatrix} S_1 \\ \cdot \\ \cdot \\ \cdot \\ S_n \end{bmatrix} = A \begin{bmatrix} P_x \\ P_y \\ Pθ_n \end{bmatrix}$$

where $S_n$ with n=1 to K, which is a natural number not less than 2, are the output signals from said plurality of sensors, $P_x$ is a motion parameter of a motion in an X direction associated with an X-Y plane of said anti-vibration table, $P_y$ is a motion parameter of a motion in a Y direction on the X-Y plane, and $Pθ_z$ is a motion parameter of a rotation motion in a θ direction on the X-Y plane.

3. An active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, wherein said plurality of sensors are arranged such that, when a motion parameter of said anti-vibration table is represented by a vector P, and an output signal group from said plurality of sensors is represented by vector S, a condition number of a matrix A defined by an equation S=AP established between the vector P and the vector S in accordance with a geometrical arrangement of said plurality of sensors is minimized, and wherein said plurality of sensors are arranged such that an angle formed by a straight line passing through each of said sensors and a center of gravity of said anti-vibration table, and the motion detection directions of said sensors are substantially equal for each of said plurality of sensors.

4. The apparatus according to claim 3, wherein said said plurality of sensors comprise three sensors respectively arranged near vertexes of a regular triangle assumed on the X-Y plane.

5. The apparatus according to claim 4, wherein said anti-vibration table has a substantially regular triangular structure having vertexes near positions where said three sensors are arranged.

6. The apparatus according to claim 5, wherein said actuators are arranged near the vertexes of said anti-vibration table having the substantially regular triangular structure.

7. The apparatus according to claim 6, wherein directions of action of said plurality actuators arranged near the vertexes of said anti-vibration table are substantially the same as the motion detection directions of said sensors arranged near said actuators.

8. The apparatus according to claim 4, wherein said actuators are arranged near the vertexes of said anti-vibration table having the regular triangle assumed on the X-Y plane.

9. The apparatus according to claim 8, wherein directions of action of said three actuators arranged near the vertexes of said anti-vibration table are substantially the same as the motion detection directions of said sensors arranged near said actuators.

10. The apparatus according to claim 3, wherein said actuators are located near each of said plurality of sensors, respectively.

11. The apparatus according to claim 10, wherein directions of action of said actuators are substantially the same as the motion detection directions of said sensors arranged near said actuators.

12. A method of manufacturing an active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, said method comprising the steps of:

arranging said plurality of sensors such that, when a motion parameter of said anti-vibration table is represented by a vector P, and an output signal group from said plurality of sensors is represented by a vector S, a condition number of a matrix A defined by an equation S=AP established between the vector P and the vector S in accordance with a geometrical arrangement of the plurality of sensors is minimized.

13. A method of manufacturing an active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, said method comprising the steps of:

arranging said plurality of sensors such that, when a motion parameter of said anti-vibration table is represented by a vector P, and an output signal group from said plurality of sensors is represented by a vector S, a condition number of a matrix A is defined by an equation S=AP established between the vector P and the vector S in accordance with a geometrical arrangement of said plurality of sensors, and a matrix W represents weight elements of the vector P, a condition number of a matrix AW obtained by multiplying the matrix A with a weighting matrix W is minimized, wherein a relationship between the vector S having elements $S_1, \ldots, S_n$ and the vector P having elements $P_x, P_y$, and $P\theta_z$ is represented as follows:

$$\begin{bmatrix} S_1 \\ . \\ . \\ . \\ S_n \end{bmatrix} = A \begin{bmatrix} P_x \\ P_y \\ P\theta_z \end{bmatrix}$$

where $S_n$, with n=1 to K, which is a natural number not less than 2, are the output signals from said plurality of sensors, $P_x$ is a motion parameter of a motion in an X direction associated with an X-Y plane of said anti-vibration table, $P_y$ is a motion parameter of a motion in a Y direction on the X-Y plane, and $P\theta_z$ is a motion parameter of a rotation motion in a $\theta$ direction on the X-Y plane.

14. A method of manufacturing an active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, said method comprising the steps of:

arranging said plurality of sensors such that, when a motion parameter of said anti-vibration table is represented by a vector P, and an output signal group from said plurality of sensors is represented by a vector S, a condition number of a matrix A defined by an equation S=AP established between the vector P and the vector S in accordance with a geometrical arrangement of the plurality of sensors is minimized, wherein said plurality of sensors are arranged such that an angle formed by a straight line passing through each of said sensors and a center of gravity of said anti-vibration table, and motion detection directions of said sensors are substantially equal for each of said plurality of sensors.

15. The method according to claim 14, wherein said the plurality of sensors comprise three sensors respectively arranged near vertexes of a regular triangle assumed on the X-Y plane.

16. The method according to claim 15, wherein said anti-vibration table has a substantially regular triangular structure having vertexes near positions where said three sensors are arranged.

17. The method according to claim 16, wherein said actuators are arranged near the vertexes of said anti-vibration table having the substantially regular triangular structure.

18. The method according to claim 17, wherein directions of action of said plurality actuators arranged near the vertexes of said anti-vibration table are substantially the same as the motion detection directions of said sensors arranged near said actuators.

19. The method according to claim 15, wherein said actuators are arranged near the vertexes of said anti-vibration table having the regular triangular structure.

20. The method according to claim 19, wherein directions of action of said actuators arranged near the vertexes of said anti-vibration table are substantially the same as the motion detection directions of said sensors arranged near said actuators.

21. The method according to claim 14, wherein said actuators are located near each of said plurality of sensors, respectively.

22. The method according to claim 21, wherein directions of action of said actuators are substantially the same as the motion detection directions of said sensors arranged near said actuators.

23. An active anti-vibration apparatus having a plurality of sensors and actuators, which detects a motion of an anti-vibration table for supporting an equipment with said plurality of sensors and controls said actuators on the basis of output signals from said sensors to drive said anti-vibration table, thereby performing an anti-vibration operation for said anti-vibration table, wherein said plurality of actuators are arranged such that, when thrusts generated by said plurality of actuators are represented by a vector x, and driving forces in units of motion modes, which act on said anti-vibration table, are represented by a vector b, a condition number of a matrix A defined by an equation Ax=b established between the vector x and the vector b in accordance with a geometrical arrangement of said plurality of actuator is minimized.

24. The apparatus according to claim 23, wherein said plurality of actuators are arranged such that a condition number of a matrix WA used instead of the matrix A and obtained by multiplying the matrix A with a normalizing matrix W for normalizing the driving forces in units of motion modes, which are represented by the vector b, is minimized.

25. An active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, wherein said plurality of actuators are arranged such that, when thrusts generated by said plurality of actuators are represented by a vector x, and driving forces in units of motion modes, which act on said anti-vibration table, are represented by a vector b, a condition number of a matrix A defined by an equation Ax=b established between the vector x and the vector b in accordance with a geometrical arrangement of said plurality of actuators is minimized, and wherein said plurality of actuators are arranged such that angles formed by straight lines passing through points of action of thrusts generated by said actuators and a center of gravity of said anti-vibration table or a center of gravity of a structure including said anti-vibration table and support members of said anti-vibration table, and lines of action of the thrusts generated by said actuators with respect to said anti-vibration table become substantially equal for said plurality of actuators.

26. The apparatus according to claim 25, wherein said anti-vibration table has a substantially regular triangular structure.

27. The apparatus according to claim 26, wherein said plurality of actuators are arranged near vertexes of said anti-vibration table having the substantially regular triangular structure, respectively.

28. The apparatus according to claim 27, wherein a relationship between the vector b having elements $F_x$, $F_y$, and $M_z$ and the vector x having elements $F_a$, $F_b$, and $F_c$ is represented as follows:

$$A \begin{bmatrix} F_a \\ F_b \\ F_c \end{bmatrix} = \begin{bmatrix} F_x \\ F_y \\ F_z \end{bmatrix}$$

where $F_x$ is a translation force to be applied in an X-axis direction associated with an X-Y plane of said anti-vibration table, $F_y$ is a translation force to be applied in a Y-axis direction on the X-Y plane, $M_z$ is a moment to be applied to rotation about a Z-axis on the X-Y plane, and $F_a$, $F_b$, and $F_c$ are thrusts to be generated by said plurality of actuators.

29. The apparatus according to claim 28, wherein said plurality of sensors are located near each of said plurality of actuators.

30. An active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, wherein said plurality of actuators are arranged such that, when thrusts generated by said plurality of actuators are represented by a vector x, and driving forces in units of motion modes, which act on said anti-vibration table, are represented by a vector b, a condition number of a matrix A defined by an equation Ax=b established between the vector x and the vector b in accordance with a geometrical arrangement of said plurality of actuators is minimized, and wherein said plurality of sensors are arranged in correspondence with said plurality of actuators.

31. A method of manufacturing an active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, said method comprising the steps of:

arranging said plurality of actuators such that, when thrusts generated by said plurality of actuators are represented by a vector x, and driving forces in units of motion modes, which act on said anti-vibration table, are represented by a vector b, a condition number of a matrix A defined by an equation Ax=b established between the vector x and the vector b in accordance with a geometrical arrangement of said plurality of actuators is minimized.

32. The method according to claim 31, wherein said plurality of actuators are arranged such that a condition number of a matrix WA used instead of the matrix A and obtained by multiplying the matrix A with a normalizing matrix W for normalizing the driving forces in units of motion modes, which are represented by the vector b, is minimized.

33. A method of manufacturing an active anti-vibration apparatus having a plurality of sensors and actuators, which detects motion of an anti-vibration table for supporting equipment with said plurality of sensors and controls said actuators on the basis of output signals from said sensors to drive said anti-vibration table, thereby performing an anti-vibration operation for said anti-vibration table, said method comprising the steps of:

arranging said plurality of actuators such that, when thrusts generated by said plurality of actuators are represented by a vector x, and driving forces in units of motion modes, which act on said anti-vibration table, are represented by a vector b, a condition number of a matrix A defined by an equation Ax=b established between the vector x and the vector b in accordance with a geometrical arrangement of said plurality of actuators is minimized, wherein said plurality of actuators are arranged such that angles formed by straight lines passing through points of action of thrusts generated by said actuators and a center of gravity of said anti-vibration table or a center of gravity of a structure including said anti-vibration table and support members of said anti-vibration table, and lines of action of the thrusts generated by said actuators with respect to said anti-vibration table become substantially equal for said plurality of actuators.

34. The method according to claim 33, wherein said anti-vibration table has a substantially regular triangular structure.

35. The method according to claim 34, wherein said plurality of actuators are arranged near vertexes of said anti-vibration table having the substantially regular triangular structure, respectively.

36. The method according to claim 35, wherein a relationship between the vector b having elements $F_x$, $F_y$, and $M_z$ and the vector x having elements $F_a$, $F_b$, and $F_c$ is represented as follows:

$$A = \begin{bmatrix} F_a \\ F_b \\ F_c \end{bmatrix} = \begin{bmatrix} F_x \\ F_y \\ F_z \end{bmatrix}$$

where $F_x$ is a translation force to be applied in an X-axis direction associated with an X-Y plane of said anti-vibration table, $F_y$ is a translation force to be applied in a Y-axis direction on the X-Y plane, $M_z$ is a moment to be applied to rotation about a Z-axis on the X-Y plane, and $Fa$, $F_b$, and $F_c$ are thrusts to be generated by said plurality of actuators.

37. The method according to claim 36, wherein said plurality of sensors are arranged in correspondence with said plurality of actuators.

38. The method according to claim 33, wherein said plurality of sensors are located near each of said plurality of actuators.

* * * * *

UNITED STATES PATENT AND TRADEMARK OFFICE
CERTIFICATE OF CORRECTION

PATENT NO. : 5,750,897

DATED : May 12, 1998

INVENTOR(S): Kato

It is certified that error appears in the above-identified patent and that said Letters Patent is hereby corrected as shown below:

On the title page, item:

[56] REFERENCES CITED:

FOREIGN PATENT DOCUMENTS, "6167414  6/1994  Japan
          7083276  3/1995  Japan" should
  read --6-167414  6/1994  Japan
        7-083276  3/1995  Japan--.

COLUMN 1:

Line 14, "ments" should read --ment--.

COLUMN 7:

Line 13, "sensor" should read --sensors--.
Line 29, "sensor" should read --sensors--.

COLUMN 8:

Line 37, "$F_z$" should read --$M_z$--.

COLUMN 10:

Line 43, "x" should read --X--.
Line 50, "$\theta Z$" should read --$\theta_z$

UNITED STATES PATENT AND TRADEMARK OFFICE
CERTIFICATE OF CORRECTION

PATENT NO. : 5,750,897

DATED : May 12, 1998

INVENTOR(S) : Kato

Page 2 of 5

It is certified that error appears in the above-identified patent and that said Letters Patent is hereby corrected as shown below:

COLUMN 11:

Equation (1):

"$\begin{bmatrix} P_x \\ & P\theta_z \\ P_y \end{bmatrix}$" should read $\begin{bmatrix} P_x \\ P_y \\ P\theta_z \end{bmatrix}$ Line 50, "$(x_c, y_c) = \left[ r\cos\left(-\dfrac{90}{6}\right), r\sin\left(-\dfrac{\pi}{6}\right) \right]$" should read --$(x_c, y_c) = \left[ r\cos\left(-\dfrac{\pi}{6}\right), r\sin\left(-\dfrac{\pi}{6}\right) \right]$--.

COLUMN 14:

Equation 7: "$b = [F_x F_y F_z]^t$ (7)"
should read --$b = [F_x F_y F_z]^T$ (7)--

UNITED STATES PATENT AND TRADEMARK OFFICE
CERTIFICATE OF CORRECTION

PATENT NO. : 5,750,897

DATED : May 12, 1998

INVENTOR(S): Kato

It is certified that error appears in the above-identified patent and that said Letters Patent is hereby corrected as shown below:

COLUMN 15:

Equation (16) "$b^T(A^{-1})^T A^{-1} b = b^T$" should read -- $b^T(A^{-1})^T A^{-1} b = \tilde{b}^T$ --.

COLUMN 18:

Equation (23) "$cvos\theta'_c$" should read -- $\cos\theta'_c$ --.

COLUMN 20:

Line 45,

"$\begin{bmatrix} S_1 \\ \cdot \\ \cdot \\ \cdot \\ S_n \end{bmatrix} = A \begin{bmatrix} P_x \\ P_y \\ P_{\theta n} \end{bmatrix}$" should read -- $\begin{bmatrix} S_1 \\ \cdot \\ \cdot \\ \cdot \\ S_n \end{bmatrix} = A \begin{bmatrix} P_x \\ P_y \\ P_{\theta z} \end{bmatrix}$ --

Line 48, "$S_n$" should read $S_n$, --.

UNITED STATES PATENT AND TRADEMARK OFFICE
CERTIFICATE OF CORRECTION

PATENT NO. : 5,750,897

DATED : May 12, 1998

INVENTOR(S) : Kato

It is certified that error appears in the above-identified patent and that said Letters Patent is hereby corrected as shown below:

COLUMN 21:

Line 9, "said said" should read --said--.
Line 22, "plurality" should read --plurality of--.

COLUMN 22:

Line 51, "said the" should read --said--.
Line 64, "plurality" should read --plurality of--.

COLUMN 23:

Line 3, "triangular structure." should read --triangle assumed on the X-Y plane.--.
Line 30, "actuator" should read --actuators--.

COLUMN 24:

Line 10,

"$$A = \begin{bmatrix} F_a \\ F_b \\ F_c \end{bmatrix} = \begin{bmatrix} F_x \\ F_y \\ F_z \end{bmatrix}$$" should read $$A \begin{bmatrix} F_a \\ F_b \\ F_c \end{bmatrix} = \begin{bmatrix} F_x \\ F_y \\ M_z \end{bmatrix}$$

UNITED STATES PATENT AND TRADEMARK OFFICE
CERTIFICATE OF CORRECTION

PATENT NO. : 5,750,897
DATED : May 12, 1998
INVENTOR(S) : Kato

It is certified that error appears in the above-identified patent and that said Letters Patent is hereby corrected as shown below:

COLUMN 26:

Line 10,

" $A = \begin{bmatrix} F_a \\ F_b \\ F_c \end{bmatrix} = \begin{bmatrix} F_x \\ F_y \\ F_z \end{bmatrix}$ should read $A \begin{bmatrix} F_a \\ F_b \\ F_c \end{bmatrix} = \begin{bmatrix} F_x \\ F_y \\ M_z \end{bmatrix}$ "

Line 18, "Fa," should read --$F_a$,--.

Signed and Sealed this

Twenty-third Day of March, 1999

Attest:

Q. TODD DICKINSON

Attesting Officer    Acting Commissioner of Patents and Trademarks